US012720876B2

(12) United States Patent
Borgers et al.

(10) Patent No.: US 12,720,876 B2
(45) Date of Patent: Aug. 25, 2026

(54) METHOD FOR CONTINUOUS PHOTOVOLTAIC CELL STRINGING AND PHOTOVOLTAIC CELL ASSEMBLY

(71) Applicants: IMEC VZW, Leuven (BE); UNIVERSITEIT HASSELT, Hasselt (BE)

(72) Inventors: Tom Borgers, Liege (BE); Marc Meuris, Keerbergen (BE)

(73) Assignees: Imec vzw, Leuven (BE); Universiteit Hasselt, Hasselt (BE)

( * ) Notice: Subject to any disclaimer, the term of this patent is extended or adjusted under 35 U.S.C. 154(b) by 451 days.

(21) Appl. No.: 18/448,542

(22) Filed: Aug. 11, 2023

(65) Prior Publication Data

US 2024/0063326 A1 Feb. 22, 2024

(30) Foreign Application Priority Data

Aug. 16, 2022 (EP) .................................... 22190454

(51) Int. Cl.
*H10F 19/90* (2025.01)
*H10F 71/00* (2025.01)
(Continued)

(52) U.S. Cl.
CPC ......... *H10F 19/904* (2025.01); *H10F 19/906* (2025.01); *H10F 71/107* (2025.01); *H10F 71/1375* (2025.01); *H10K 39/12* (2023.02)

(58) Field of Classification Search
CPC ............... H01L 31/188; H01L 31/0512; H01L 31/0508; H01L 31/206; H01L 31/0504;
(Continued)

(56) References Cited

U.S. PATENT DOCUMENTS

2009/0269877 A1* 10/2009 Pinarbasi .............. H10F 77/126 118/100
2010/0219420 A1 9/2010 Hild
(Continued)

FOREIGN PATENT DOCUMENTS

EP 1868250 A2 12/2007
EP 3258503 A1 12/2017

OTHER PUBLICATIONS

Extended European Search Report and Written Opinion, Application No. EP22190454.3, mailed Feb. 2, 2023, 6 pages.

*Primary Examiner* — Earl N Taylor
(74) *Attorney, Agent, or Firm* — McDonnell Boehnen Hulbert & Berghoff LLP

(57) ABSTRACT

Example embodiments relate to methods for continuous photovoltaic cell stringing and photovoltaic cell assemblies. An example method includes providing a foil in a provision direction in a continuous manner. The method also includes cutting at least one slit into the foil along the provision direction. Additionally, the method includes creating at least one slit opening by folding open the foil at a location of the at least one slit. Further, the method includes providing at least one electrically conductive wire near a first surface of the foil along the provision direction aligned with the at least one slit opening in a continuous manner. Yet further, the method includes folding back the foil at the at least one slit opening after the electrically conductive wire provision such that the at least one electrically conductive wire changes its position.

20 Claims, 22 Drawing Sheets

(51) Int. Cl.
*H10F 71/10* (2025.01)
*H10K 39/12* (2026.01)

(58) Field of Classification Search
CPC ... H01L 31/1804; H01L 31/202; H10K 39/12; H10K 39/18; H10F 19/904; H10F 19/906; H10F 71/1375; H10F 71/107
See application file for complete search history.

(56) References Cited

U.S. PATENT DOCUMENTS

| | | | | |
|---|---|---|---|---|
| 2014/0102502 | A1* | 4/2014 | Luch | H10F 77/223<br>136/252 |
| 2014/0352777 | A1* | 12/2014 | Hachtmann | H10F 77/1698<br>136/256 |
| 2018/0097125 | A1* | 4/2018 | Sewell | H01L 24/78 |
| 2018/0190837 | A1* | 7/2018 | Reich | H10F 19/908 |
| 2019/0305167 | A1* | 10/2019 | Sewell | H10F 19/904 |
| 2019/0312163 | A1* | 10/2019 | Lu | B23K 26/244 |
| 2019/0312166 | A1* | 10/2019 | Lu | H10F 10/146 |
| 2021/0098641 | A1* | 4/2021 | Sewell | H10F 77/219 |
| 2021/0408313 | A1* | 12/2021 | Lu | H10F 77/937 |
| 2022/0173261 | A1* | 6/2022 | Bettinelli | H10F 71/137 |

* cited by examiner 10a
22
23
3
1
10b 10a
24a
Hot roller
24b
Hot roller
3
3
2
3
1
10b

METHOD FOR CONTINUOUS PHOTOVOLTAIC CELL STRINGING AND PHOTOVOLTAIC CELL ASSEMBLY

CROSS-REFERENCE TO RELATED APPLICATIONS

The present application is a non-provisional patent application claiming priority to European Patent Application No. EP 22190454.3, filed Aug. 16, 2022, the contents of which are hereby incorporated by reference.

FIELD OF THE DISCLOSURE

The disclosure relates to a method for continuous photovoltaic cell stringing and a photovoltaic cell assembly being producible thereby.

BACKGROUND

Generally, in times of an increasing use of renewable energies (e.g., solar photovoltaic electricity), there is a growing need for methods for electrically interconnecting photovoltaic cells (also referred to as "photovoltaic cell stringing"), in particular cost-efficient and fast methods enabling mass production with a minimum of defective manufacture, and for photovoltaic cell assemblies, such as linear arrays of electrically interconnected photovoltaic cells (also referred to as "photovoltaic cell strings"), being producible thereby, in particular photovoltaic cell strings having reliable electrical interconnections.

Several methods for photovoltaic cell stringing are possible, where the photovoltaic cells are electrically connected using electrically conductive solderable or adhesive elements such as electrically conductive solderable ribbons, electrically conductive adhesive tape or electrically conductive wires, where the electrically conductive wires may for example be attached to a transparent electrically insulating carrier, e.g. a foil.

EP 1 868 250 A2 discloses a method for photovoltaic cell stringing where photovoltaic cells are electrically interconnected using a collector-connector including an electrically insulating carrier and at least one electrical conductor which electrically connects a first and a second photovoltaic cell. The electrically insulating carrier may include a flexible, electrically insulating polymer film having a sheet or ribbon shape. The electrical conductor may include any electrically conductive trace or wire. It may be applied to the insulating carrier, which acts as a substrate during deposition of the conductor. In the different embodiments and configurations disclosed, fabrication of the collector-connector and the actual cell stringing are separate processes. This may disadvantageously lead to an undesirably slow, complex, and/or expensive fabrication method.

SUMMARY

Accordingly, a method for continuous photovoltaic cell stringing and a photovoltaic cell assembly being producible thereby, thereby ensuring a fast, straightforward, error-resistant, and cost-efficient manufacture are provided.

This is provided by the features of the first independent claim for a method for continuous photovoltaic cell stringing and the features of the second independent claim for a photovoltaic cell assembly being producible by such a method. The dependent claims contain further developments.

According to a first aspect, a method for continuous photovoltaic cell stringing is provided. The method includes the steps of providing a foil in a provision direction in a continuous manner, cutting at least one slit into the foil along the provision direction, creating at least one slit opening by folding open the foil at the location of the at least one slit, providing at least one electrically conductive wire near a first surface of the foil along the provision direction aligned with the at least one slit opening in a continuous manner, and folding back the foil at the at least one slit opening after the electrically conductive wire provision such that the at least one electrically conductive wire changes its position from the first surface to a second surface being opposite to the first surface of the foil in the region of the at least one slit opening, thereby closing the at least one slit opening while maintaining the at least one slit. In this manner, a fast, straightforward, error-resistant, and cost-efficient manufacturing can be ensured.

In some embodiments, the foil may include an electrically insulating material.

In some embodiments, the foil includes a basic layer and two sandwich layers sandwiching the basic layer. Additionally or alternatively, for the cutting, a cutter wheel or punch stamp or a laser is used. In addition to this or as an alternative, creating the at least one slit opening may include making use of at least one cam wheel (e.g., for folding open the foil). Further additionally or further alternatively, the electrically conductive wire provision includes making use of at least one roller reel (e.g., for unrolling the at least one electrically conductive wire). In some embodiments, a foil can also be used without a basic layer and two sandwich layers, for instance, a single layer foil with a rather low melting point such as polyolefin encapsulant material. Further, a glass fiber filled encapsulant foil (e.g., a three-layer foil with glass fiber filling in at least one of the layers) may be used.

In some embodiments, the two sandwich layers have a lower melting point than a melting point of the basic layer. For instance, the sandwich layers of the foil, and thus the first surface and the second surface of the foil, may become sticky in the case of heating, without thereby affecting the mechanical properties of the basic layer, thus reducing a risk of affecting the foil stability such as the shape stability of the foil. This enables a very efficient adhesion, such as adhesion of an electrically conductive wire or of a photovoltaic cell, to a surface of the foil.

In this context, the adhesive layer thickness may not exceed the thickness of the electrically conductive wire (e.g., to avoid a fully embedded wire into the adhesive layer, such as when the layer is melted during wire attachment instead of made sticky).

In some embodiments, the method further includes the step of attaching the at least one electrically conductive wire to the foil, such as to the first surface of the foil (e.g., by heating the foil at least in the region of the at least one electrically conductive wire, by melting the foil at least in the region of the at least one wire, or by heating the foil at least in the region of the at least one electrically conductive wire to a temperature lower than the melting temperature of the foil, such as of the sandwich layers). Alternatively, the method further includes the step of attaching the at least one electrically conductive wire to the foil by heating (e.g., Joule heating) the at least one electrically conductive wire. For example, melting the foil or its respective sandwich layer, respectively, is not necessary, but may be sufficient to make the foil (e.g., foil surfaces or the sandwich layer, such as sandwich layer surfaces) become sticky.

In some embodiments, heating the foil includes heating to a temperature such that the at least one electrically conductive wire adheres to the foil. In addition to this or as an alternative, the electrically conductive wire attachment includes making use of at least one hot roller and/or an energy source for heating (e.g., Joule heating) the at least one electrically conductive wire. For instance, a rather low temperature can be used, thereby saving costs and energy, because it is basically sufficient to make the respective surface of the foil become sticky.

In some embodiments, the method further includes the step of forming at least one perforation through the at least one electrically conductive wire and through the foil in a first edge region of the at least one slit, thereby cutting and/or interrupting the at least one electrically conductive wire in the first edge region of the at least one slit. For example, an electrical connection, in particular an electrical series connection, can be established between a first photovoltaic cell and a second photovoltaic cell at a later stage (e.g., after subsequent folding or over-folding) without causing electrical shorts.

In this context, it is noted that not only the electrically conductive wire but also the foil is interrupted at the respective location of the electrically conductive wire interruptions.

Additionally, it is noted that interruption of the foil can also be done before, at the step of slit cutting (e.g., depending on the cutting pattern used).

In some embodiments, forming the at least one perforation, and thus the electrically conductive wire interruption, includes making use of a punch stamp or a laser. For instance, a high production speed and straightforwardness can be ensured, which leads to an increased cost efficiency.

In some embodiments, the method may include the steps of arranging at least two photovoltaic cells on the foil (e.g., on the first surface of the foil) such that an edge region of a first one of the at least two photovoltaic cells overlaps part of the at least one perforation formed at the first edge region of the at least one slit (e.g., in an area where the at least one electrically conductive wire is interrupted), an edge region of a second one of the at least two photovoltaic cells overlaps a second edge region of the at least one slit (e.g., in an area where the at least one electrically conductive wire is not interrupted), or a substantial region of the at least one slit is not covered with any of the at least two photovoltaic cells and attaching the at least two photovoltaic cells to the foil (e.g., to the first surface of the foil).

In some embodiments, such arrangement of the at least two photovoltaic cells on the foil enables wire insulation by the electrically insulating foil at lateral edges of the first one and the second one of the at least two photovoltaic cells correspond to both respective edge regions (e.g., after subsequent folding or over-folding).

In some embodiments, arranging the at least two photovoltaic cells includes arranging the at least two photovoltaic cells with a front surface facing the foil. In some embodiments, arranging the at least two photovoltaic cells includes arranging the at least two photovoltaic cells in a region where the at least one electrically conductive wire is positioned at the first surface of the foil. This may enable the establishment of an electrical contact between the front side of the first photovoltaic cell and at least one electrically conductive wire, and between the front side of the second photovoltaic cell and at least one electrically conductive wire (e.g., after the step of attaching the at least two photovoltaic cells to the foil).

In some embodiments, attaching the at least two photovoltaic cells to the foil or the first surface of the foil is done by heating the foil at least in the region of the at least two photovoltaic cells (e.g., by melting the foil at least in the region of the at least two photovoltaic cells or by heating the foil at least in the region of the at least two photovoltaic cells to a temperature such that the at least two photovoltaic cells adhere to the foil).

In some embodiments, in this manner, an electrical contact is established between a side of the at least one photovoltaic cell oriented towards the foil and the at least one electrically conductive wire. For example, in embodiments where the at least one photovoltaic cell is oriented with a front surface or front side oriented towards the first surface of the foil, an electrical contact may be established between a front side of the at least one photovoltaic cell and the at least one electrically conductive wire. Further, in this manner, an efficient preparation may be made (e.g., for subsequent folding or over-folding, respectively).

In some embodiments, the method may further include the steps of folding the first one of the at least two photovoltaic cells over a substantial region of the at least one slit, for example such that the first one and the second one of the at least two photovoltaic cells do not overlap with respect to each other (e.g., the foil may be double-folded, such as in a region at respective lateral sides of the at least one electrically conductive wire), and attaching the first one of the at least two photovoltaic cells to the foil in the substantial region of the at least one slit.

Alternatively, the step of folding the first one of the at least two photovoltaic cells over a substantial region of the at least one slit may be such that the first one and the second one of the at least two photovoltaic cells slightly overlap.

With respect to the above-mentioned lateral sides, it is noted that a lateral side may be a side in a direction substantially orthogonal to the provision direction, or alternatively formulated a side next to a longitudinal side of the at least one electrically conductive wire.

In some embodiments, attaching the first one of the at least two photovoltaic cells to the foil is done by heating the foil at least partly in the region of the first one of the at least two photovoltaic cells (e.g., by melting the foil at least partly in the region of the first one of the at least two photovoltaic cells or by heating the foil at least partly in the region of the first one of the at least two photovoltaic cells to a temperature such that the first one of the at least two photovoltaic cells adheres to the foil).

In this manner (e.g., in particular in the heating area), an electrical contact can be established between a side of the first photovoltaic cell oriented towards the foil as a result of the folding step and the at least one electrically conductive wire. For example, in embodiments where the at least one photovoltaic cell has been oriented with a front surface or front side oriented towards the first surface of the foil in the previous step of arranging the photovoltaic cells on the foil, a rear side of the first photovoltaic cell may be oriented towards the foil as a result of the folding step, and an electrical contact can be established between the rear side (back side) of the first photovoltaic cell and the at least one electrically conductive wire, in particular in the heating area.

For instance, it may be sufficient to make the foil become sticky at least partly in the region of the first one of the at least two photovoltaic cells, thereby saving costs and energy due to a rather low heating temperature such as between 100 and 110 degrees Celsius.

Further, it may also be possible to have one slit per two electrically conductive wires or even more. This reduces the number of slits in the foil per cell (e.g., because the shape of the slit is wider to contain several electrically conductive wires), which can be applied when a very high density of parallel electrically conductive wires is aimed for.

In some embodiments, for the step of folding, at least a part of the foil is held in place in the region of the at least one slit (e.g., at least a part of the foil in the region of the at least one slit where the at least one electrically conductive wire has been provided, such as by a vacuum). In some embodiments, for example, a straightforward and cost-efficient folding step can be ensured.

In some embodiments (e.g., after the step of arranging the at least two photovoltaic cells on the foil), the method may further include the step of arranging at least one diode (e.g., at least one thin-film diode or a thin-film diode strip) in the second edge region of the at least one slit. In some embodiments, the at least one diode may be arranged such that it does not overlap the at least two photovoltaic cells. For instance, a diode implementation (e.g., a bypass diode implementation) can be achieved in an efficient manner.

In some embodiments (e.g., after the step of cutting), the method may further include the step of stretching the foil in the provision direction (e.g., in order to create at least one local expanded foil area, such as in an edge region of the at least one slit). This may allow for compensating for undesired effects of differences between respective coefficients of thermal expansion of photovoltaic cell materials and further materials used in the manufacturing (e.g., in the context of a corresponding module). Further, for instance, it enables manufacturing stretchable photovoltaic cell strings.

In some embodiments (e.g., after the electrically conductive wire interruption), the method may also include the step of arranging an electrically conductive sheet on the foil such that a first edge region of the electrically conductive sheet overlaps part of the at least one perforation and a second, opposite, edge region of the electrically conductive sheet overlaps the first edge region of the at least one slit (e.g., where the conductive sheet and/or the foil is stretchable). In some embodiments, for example, this allows for the compensation of undesired effects of differences between respective coefficients of thermal expansion of photovoltaic cell materials and further materials used in the manufacturing (e.g., in the context of a corresponding module). Further, for example, it may enable the manufacture of stretchable photovoltaic cell strings.

In some embodiments, the method is used for stringing of chalcogenide photovoltaic cells, such as copper indium gallium selenide photovoltaic cells or cadmium telluride cells, or for stringing of silicon photovoltaic cells or perovskite photovoltaic cells or organic photovoltaic cells or amorphous silicon photovoltaic cells. In some embodiments, for example, the method can be used for series joining of bifacially contactable solar cells, thereby ensuring a particularly high flexibility, and thus also efficiency.

According to a second aspect, a photovoltaic cell assembly is provided. The photovoltaic cell assembly may be produced by the steps of example methods.

BRIEF DESCRIPTION OF THE DRAWINGS

Example embodiments are now further explained with respect to the drawings by way of example only, and not for limitation. In the drawings.

DETAILED DESCRIPTION

Figure 1:
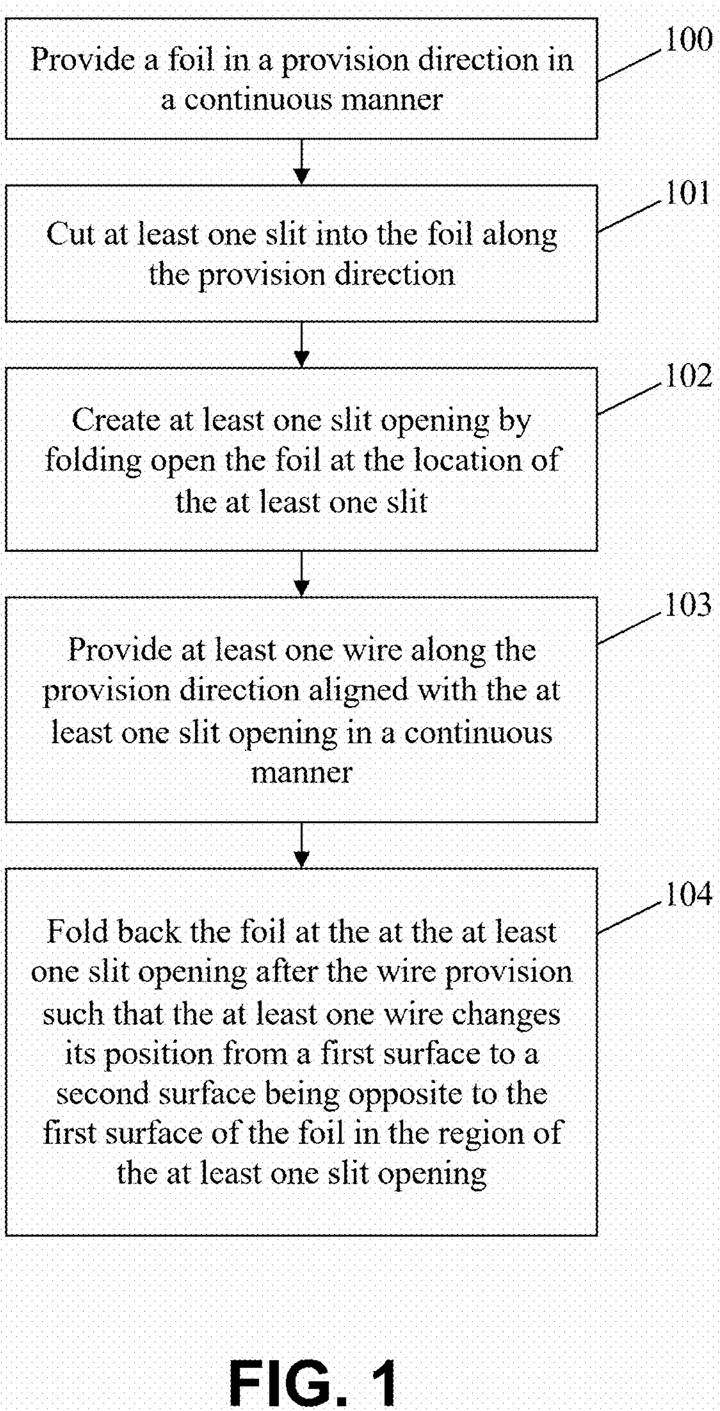
FIG. 1 shows a flow chart of a continuous photovoltaic cell stringing, according to example embodiments.

FIG. 1 shows a flow chart of an embodiment of the method for continuous photovoltaic cell stringing. In a first step 100, a foil is provided in a provision direction in a continuous manner. Then, in a second step 101, at least one slit is cut into the foil along the provision direction. Furthermore, in a third step 102, at least one slit opening is created by folding open the foil at the location of the at least one slit. Moreover, in a fourth step 103, at least one electrically conductive wire is provided near a first surface of the foil along the provision direction aligned with the at least one slit opening in a continuous manner. In addition to this, in a fifth step 104, the foil is folded back at the at least one slit opening after the electrically conductive wire provision such that the at least one electrically conductive wire changes its position from the first surface to a second surface being opposite to the first surface of the foil in the region of the at least one slit opening.

Figures 2, 3:
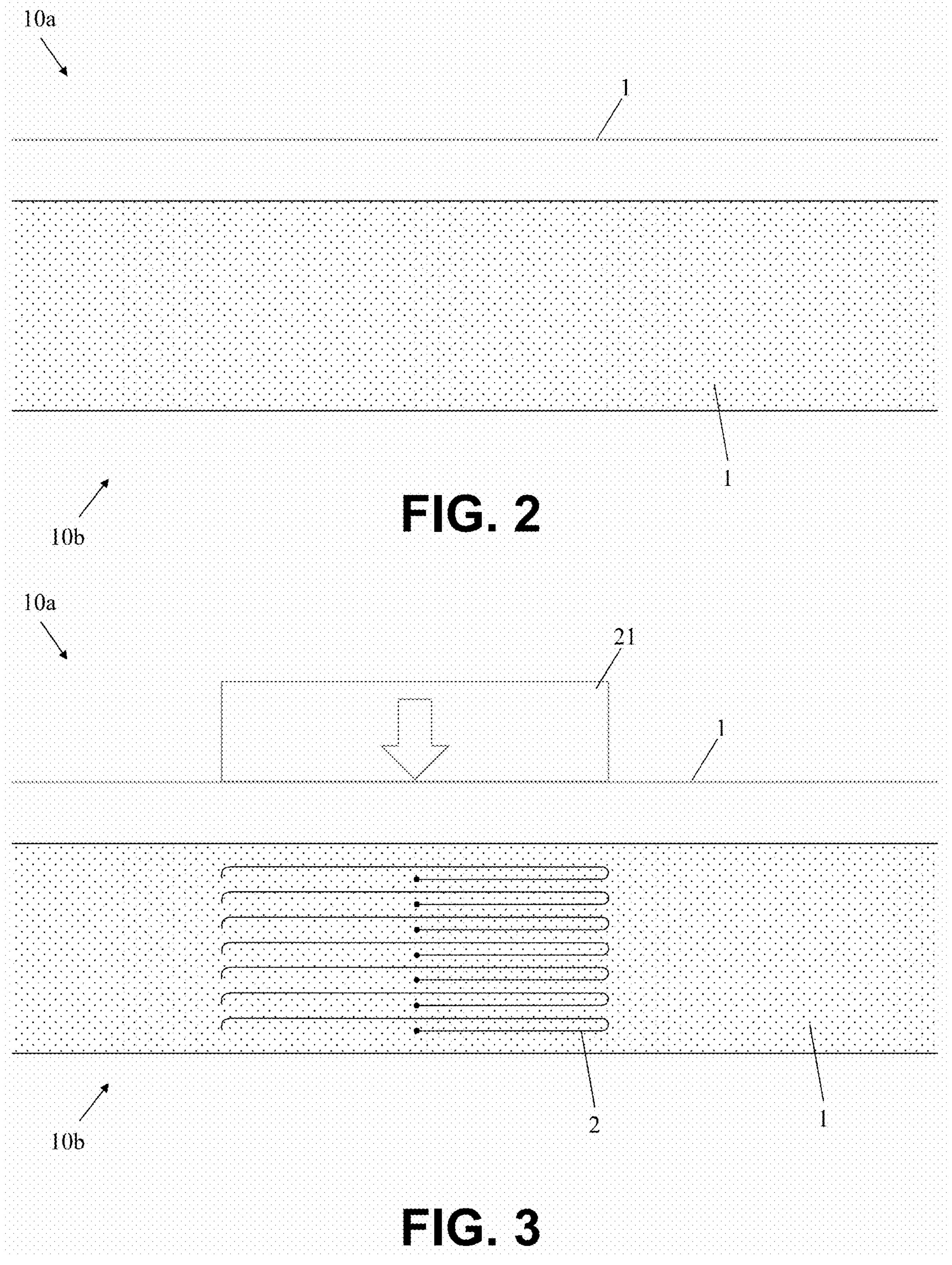
FIG. 2 shows a step of a method of producing a photovoltaic cell assembly, according to example embodiments.
FIG. 3 shows a step of a method, according to example embodiments.

Furthermore, FIG. 2 illustrates an example step in the context of producing a photovoltaic cell assembly. In accordance with FIG. 2, a foil 1 is provided, for example unrolled, in a provision direction in a continuous manner. FIG. 2 shows the side view 10*a* of foil 1 and the view of a surface of foil 1 (e.g. a top view 10*b* of foil 1), further referred to as the second surface of foil 1.

In some embodiments, the foil 1 may be made of a mono-layer thermoplastic material or a multi-layer material such as a three-layer material with a high-temperature melting point core layer such as a basic layer and outer layers (sandwich layers) with a lower melting point than the core layer or the basic layer, respectively. Additionally or alternatively, the provision of the foil 1 may be performed with the aid of an inline conveyor or belt-process.

Moreover, according to FIG. 3, in another step, the foil 1 is cut in accordance with a cutting pattern 2 with the aid of a cutter wheel, laser cutter, or punch stamp 21. In some embodiments, cutting pattern 2 may be configured to cut longitudinal slits extending along the provision direction through the foil 1, such as slits in the form of a finger outline, thereby forming foil-fingers or at least a kind thereof as schematically illustrated in FIG. 3. Cutting pattern 2 may be configured such that no parts of the foil 1 come off from the foil 1 as a result of the cutting step. In an example, the foil-fingers may not come off as a whole from the foil 1. In this context, cutting pattern 2 may lead to at least one slit (e.g., multiple slits) through the foil 1.

Figures 4, 5:
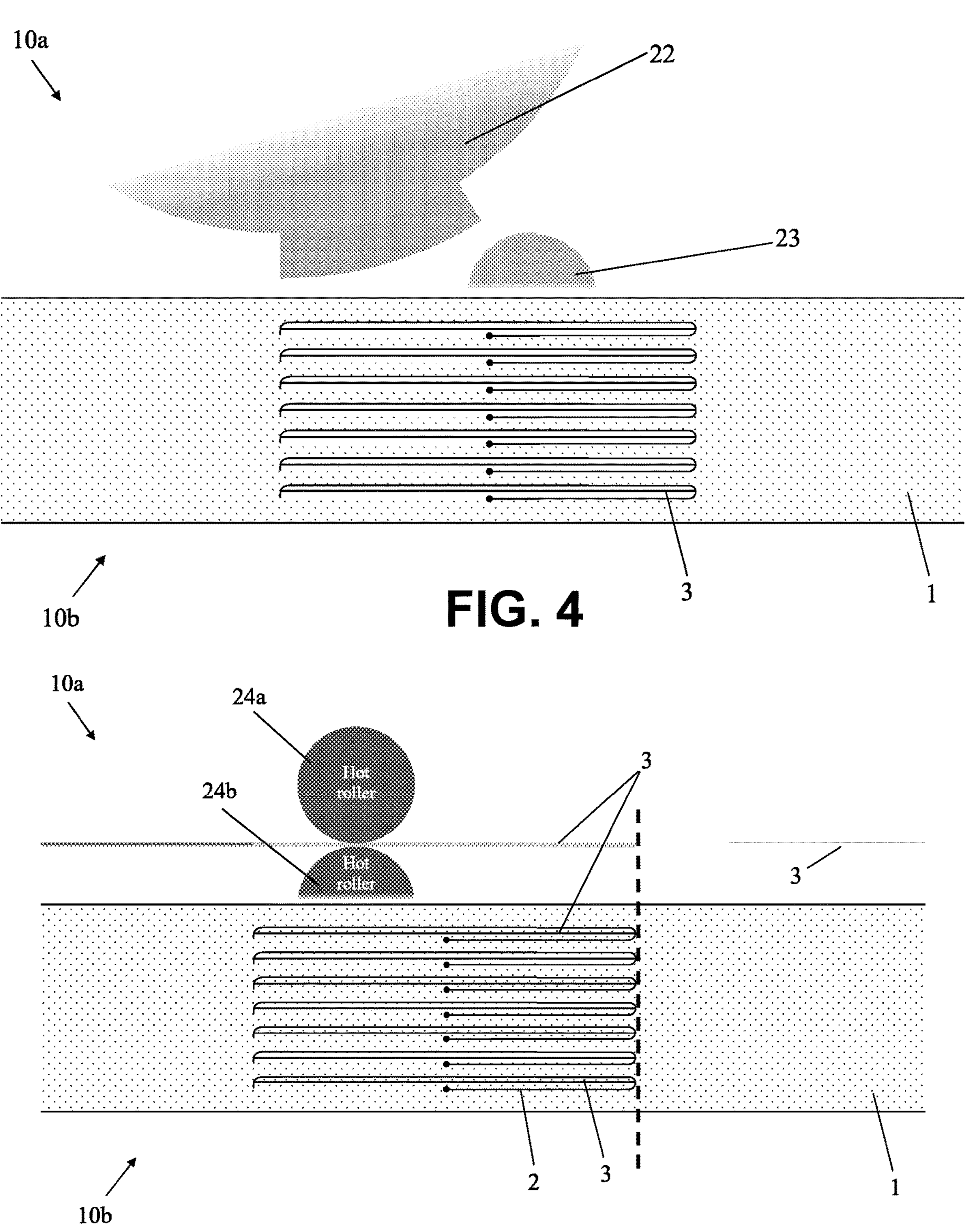
FIG. 4 illustrates a step of a method, according to example embodiments.
FIG. 5 depicts a step of manufacturing a photovoltaic cell assembly, according to example embodiments.

In another step, as it can be seen from FIG. 4, the multiple slits through the foil 1 are folded open with the aid of a camwheel 22 during unrolling of an electrically conductive wire or electrically conductive wires, respectively, 3 from a roller reel 23. The electrically conductive wires are provided near a surface of the foil 1, for example the first surface of the foil 1 (the first surface being the bottom surface opposite to the top surface 10*b* in the example of FIG. 4), along the provision direction and they are aligned with the slit pattern. In this context, the slits fold back after electrically conductive wire unrolling. Electrically conductive wires 3 thereby switch (change position) from the first surface of the foil 1 or the bottom side of the foil 1, respectively, to the second surface of the foil 1 or the top side of the foil 1, respectively, in the region of the cutting pattern 2.

Now, with respect to FIG. 5, a further step is illustrated. In this context, the foil 1 is heated, for example melted, with the aid of hot rollers 24*a*, 24*b* at least in the region of the electrically conductive wires, to thereby attach the electrically conductive wires 3 to the foil 1. With respect to the electrically conductive wires 3, it is noted that it can be seen in side view 10*a* or in top view 10*b*, respectively, of FIG. 5 that, electrically conductive wires 3 have switched from the first surface of the foil 1 or the bottom side of the foil 1, respectively, to the second surface of the foil 1 or the top side of the foil 1, in the region of the cutting pattern 2, as described above. As an alternative to or in addition to heating of the foil, the electrically conductive wires 3 may be heated to attach the electrically conductive wires 3 to the foil 1.

Figures 6, 7:
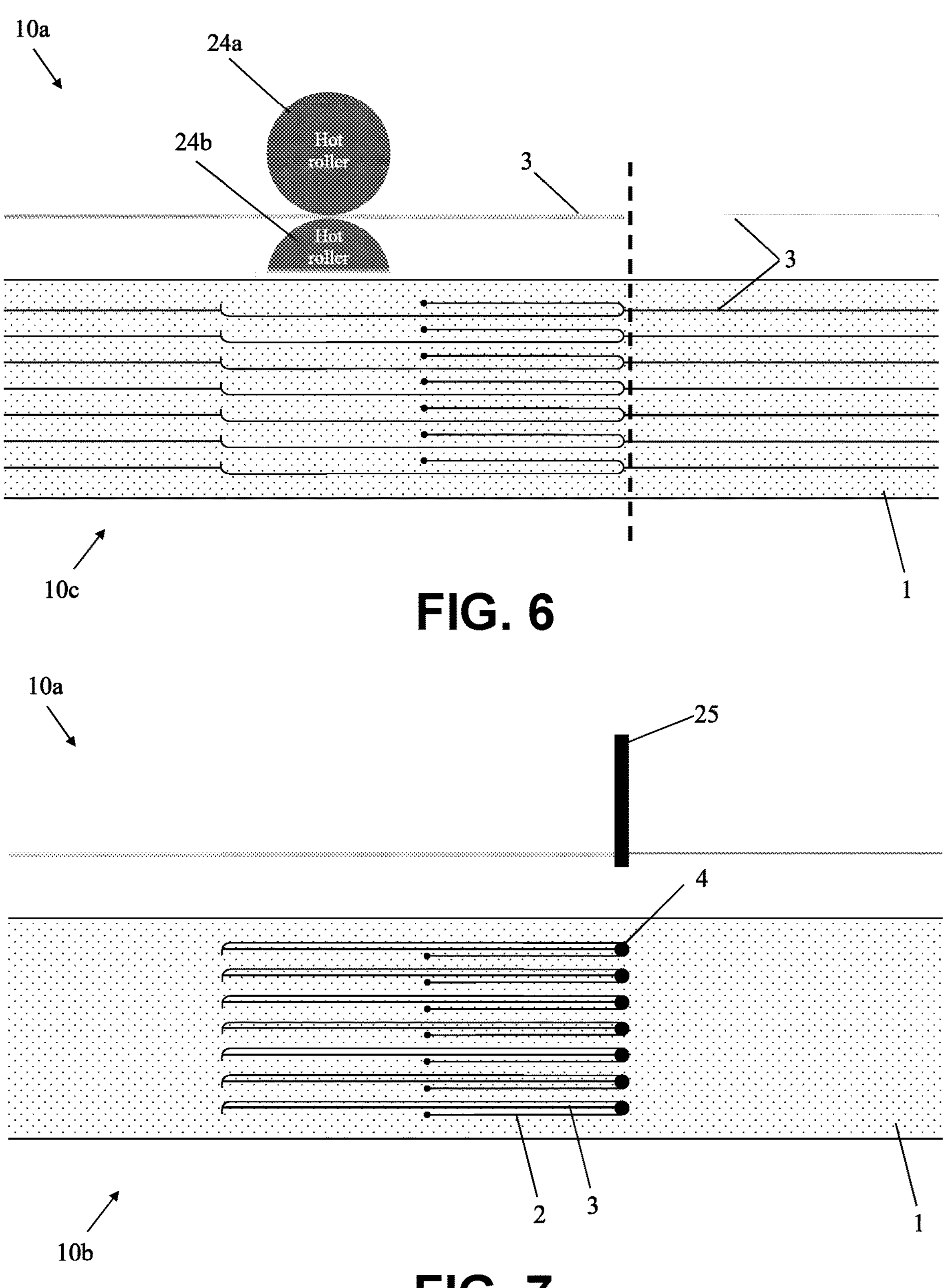
FIG. 6 shows the step of FIG. 5 from a bottom view, according to example embodiments.
FIG. 7 illustrates a step of a method, according to example embodiments.

Electrically conductive wires 3 on the bottom side of the foil 1, in regions outside the region of the cutting pattern 2, can be seen from FIG. 6 illustrating a view of the first surface of the foil 1 or a bottom view 10*c* of the foil 1, respectively.

In accordance with FIG. 7, in another step, the electrically conductive wires 3 are interrupted or punched or cut, respectively, with the aid of a punch stamp 25 in the region of an edge (e.g., a first edge region) of the cutting pattern 2 such that respective perforations or punch holes 4 are created through the electrically conductive wires 3 and through the foil 1.

Figures 8, 9:
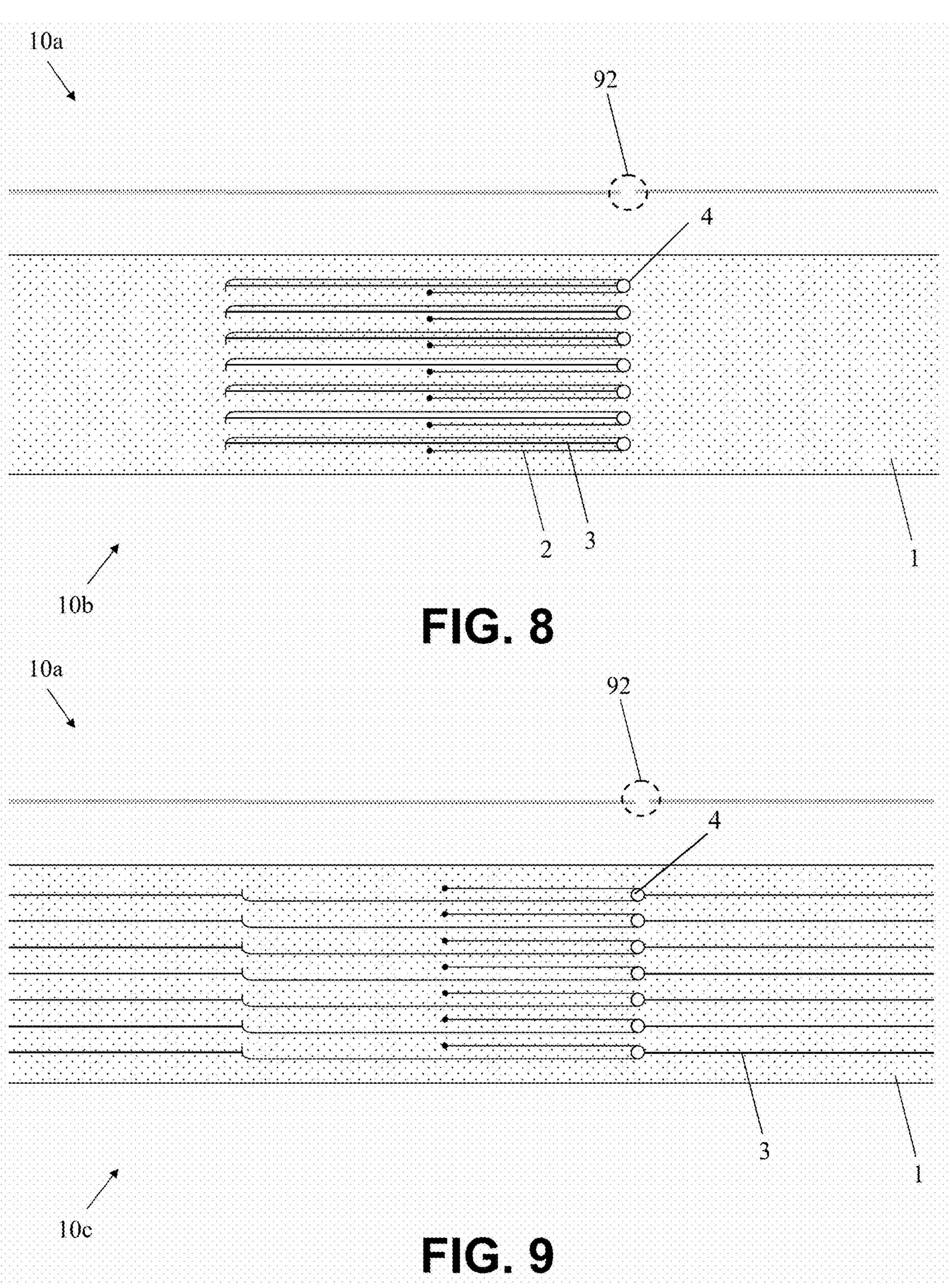
FIG. 8 shows the step of FIG. 7 with further details, according to example embodiments.
FIG. 9 shows the step of FIG. 8 from a bottom view, according to example embodiments.

In this context, in some embodiments, the electrically conductive wires 3 may be cut over a length between 0.5 and 4 millimeters (e.g., between 2.5 and 3.5 millimeters, between 2.8 and 3.2 millimeters, or 3 millimeters) as illustrated by reference sign 92 in FIG. 8 with respect to the top view 10*b* and in FIG. 9 with respect to the bottom view 10*c* of the foil 1.

However, the present disclosure is not limited to these ranges. For example, the electrically conductive wires 3 may be cut over larger or smaller distances than the above-mentioned lengths. Other cutting dimensions may be used, for example depending on the cell design, the cell metallization design, the thickness of the electrically conductive wires, the foil thickness and/or the cutting technique used.

Figures 10, 11:
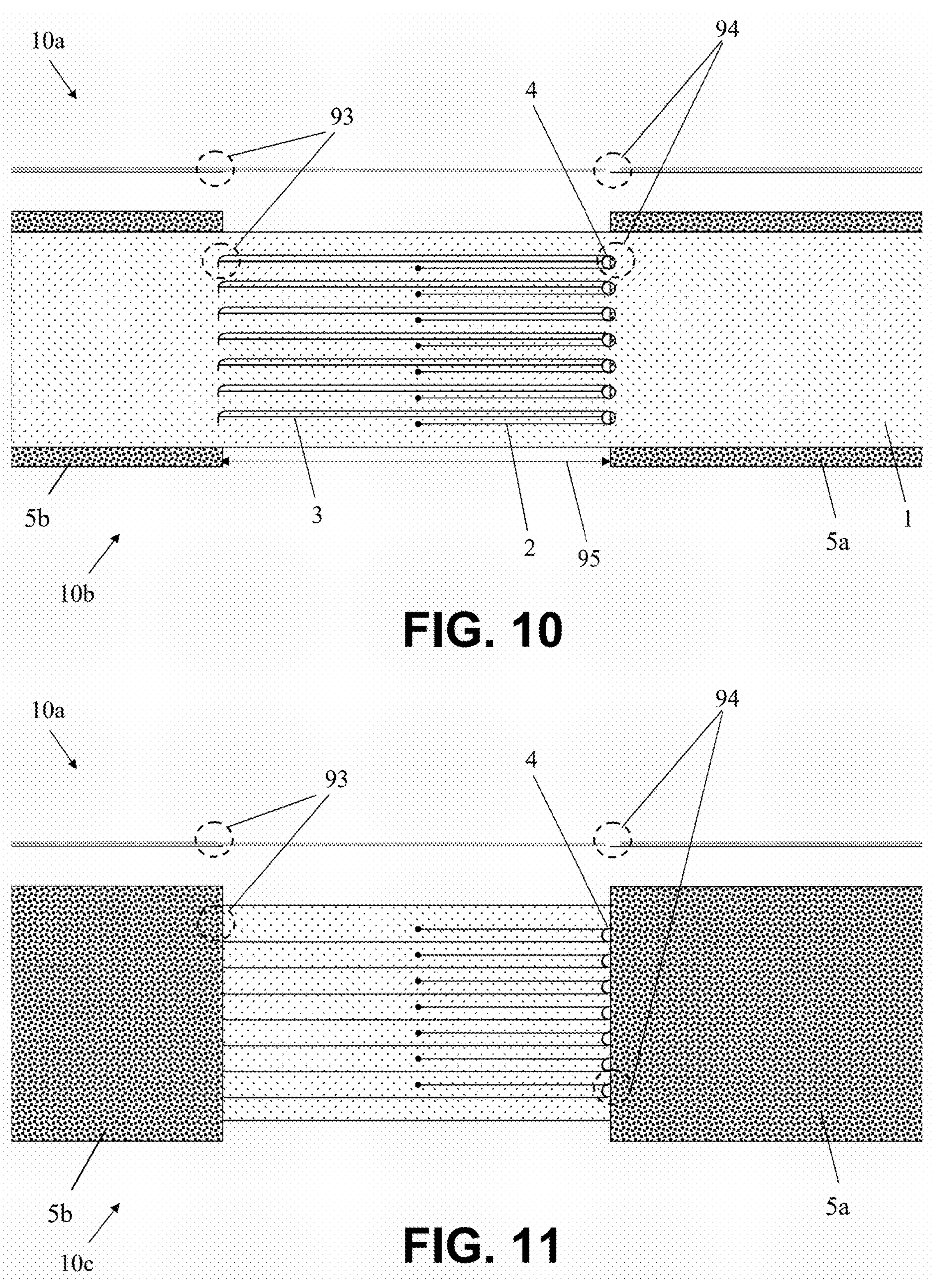
FIG. 10 shows a step of a method of producing a photovoltaic cell assembly, according to example embodiments.
FIG. 11 shows the step of FIG. 10 from a bottom view, according to example embodiments.

Furthermore, according to FIG. 10, in another step, photovoltaic cells 5*a*, 5*b* are placed on the foil 1, in particular on the first surface of the foil 1 in the example shown. A first photovoltaic cell 5*a* is arranged such that a first edge region of the first photovoltaic cell partly overlaps the perforations 4 formed at the first edge region of the cutting pattern 2, for example such that the corresponding first edge of the first photovoltaic cell extends between 0.5 and 1.5 millimeters (e.g., between 0.7 and 1.3 millimeters, between 0.9 and 1.1 millimeters, or 1 millimeter) beyond the electrically conductive wires 3 (e.g., in the region of the punch holes 4 where the electrically conductive wires 3 are interrupted) as marked by reference sign 94. However, the present disclosure is not limited to these overlap ranges. In particular, the first photovoltaic cell 5*a* is arranged such that a second edge region opposite to the first edge region faces away from the region of the cutting pattern 2 such that it does not overlap with the cutting pattern 2. The second edge region of the first photovoltaic cell 5*a* may overlap an edge region of another cutting pattern, for example another cutting pattern formed earlier (located further in the provision direction), in particular an edge region without punch holes.

As it can further be seen from FIG. 10, a second photovoltaic cell 5*b* is arranged such that a second edge region of the second photovoltaic cell overlaps a second edge region of the cutting pattern 2, where the amount of overlap in the provision direction is for example between 0.5 and 1.5 millimeters (e.g., between 0.7 and 1.3 millimeters, between 0.9 and 1.1 millimeters, or 1 millimeter), such as in the region of an edge of the cutting pattern 2 without the punch holes 4 as marked by reference sign 93. However, the present disclosure is not limited to these overlap ranges. In particular, the second photovoltaic cell 5*b* is arranged such that a first edge region opposite to the second edge of the second photovoltaic cell 5*b* faces away from the region of the cutting pattern 2. The first edge region of the second photovoltaic cell 5*b* may overlap an edge region of another cutting pattern, for example another cutting pattern formed later in the provision direction, in particular an edge region with punch holes.

In some embodiments, a substantial part or a substantial region of the cutting pattern 2 remains uncovered by any photovoltaic cell.

It is further noted that in the context of the above-mentioned first photovoltaic cell 5*a* and the second photovoltaic cell 5*b*, photovoltaic cells are basically marked with reference sign 5 in further embodiments as described below.

Additionally, reference sign 95 of FIG. 10 marks a distance between the respective cells in the provision direction, in particular a distance between a first edge (at the first edge region) of the first photovoltaic cell 5*a* and a second edge (at the second edge region) of the second photovoltaic cell 5*b*. In some embodiments, the distance may be equal to between 20 and 200 millimeters (e.g., between 40 and 80 millimeters). However, the present disclosure is not limited thereto. More in general, the distance may be equal to the sum of the corresponding cell width and the corresponding intended cell spacing between the first photovoltaic cell 5*a* and the second photovoltaic cell 5*b*, if any, such as in the final photovoltaic cell assembly. It is noted that the distance can also be smaller than the cell width to create a small overlap between the first photovoltaic cell 5*a* and the second photovoltaic cell 5*b* in the final cell assembly, if desired.

With respect to the cell width, it is noted that the cell width may be the cell size in the provision direction. With respect to the cell spacing, it is noted that the cell spacing may be the distance between the first edge of the first photovoltaic cell 5*a* and a second edge of the second photovoltaic cell 5*b* in the provision direction.

Figures 12, 13:
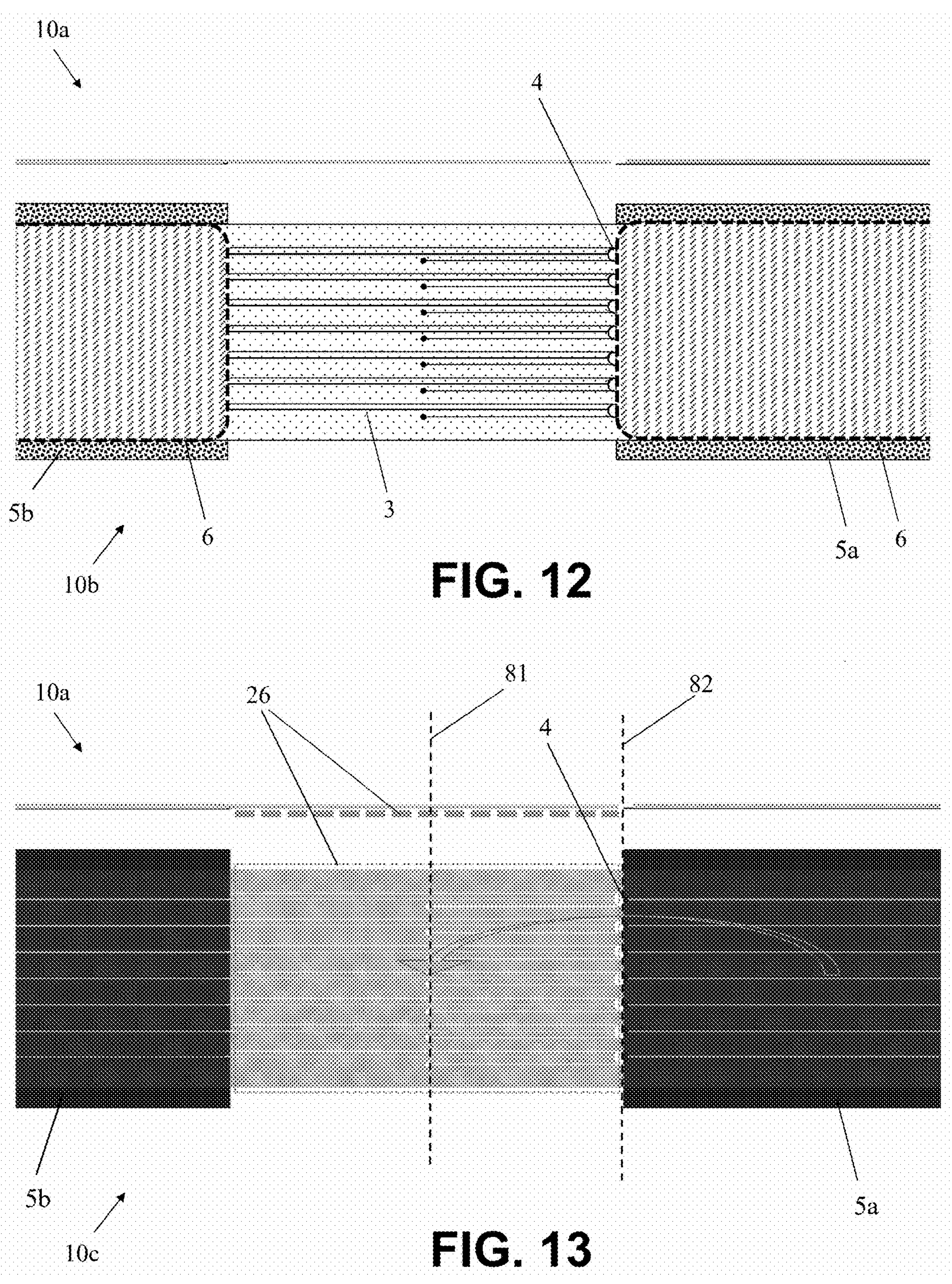
FIG. 12 shows the step of FIG. 10 with further details, according to example embodiments.
FIG. 13 shows a step of a method, according to example embodiments.

With respect to FIG. 11, it is noted that FIG. 11 shows the situation of FIG. 10 in the context of the respective bottom view 10*c*. Furthermore (e.g., in the context of FIG. 10 and FIG. 11), FIG. 12 illustrates a step of attaching the photovoltaic cells to the foil 1, in particular to the first surface of the foil 1 in the example shown, by heating the foil in heating areas 6. Accordingly, the foil 1 adheres to the respective full top side or top surface (front side or front surface) of the corresponding cell. Thereby also the electrically conductive wires 3 adhere to the front surface of the corresponding cell in the heating areas 6, such that an electrical front contact (electrical contact to the front side) may be provided thereto. In some embodiments, the heating areas 6 or heated surfaces, respectively, may be heated to a temperature between 100 and 120 degrees Celsius.

In this context, the wires may be physically in contact with the cell, and a final soldered or conductive adhesive cured (if applicable) electrical connection may be provided potentially at a later stage, during lamination of the module, as the applied temperature might be higher in the module lamination step.

In another step according to FIG. 13, the respective photovoltaic cells 5 and the foil 1 are over-folded. In this context, at least a part of the foil 1 may be kept down and held in place by a vacuum 26 (e.g., a bottom-side belt vacuum), such as in regions of the cutting pattern 2 where the electrically conductive wires 3 are attached to the foil. As it can further be seen from FIG. 13, two respective folding lines 81 and 82 being, for example, perpendicular to the provision direction of the foil 1 are illustrated. In this context, in the example shown, the folding line 81 halves the cutting pattern 2, whereas the folding line 82 runs through an edge of the cutting pattern 2 (e.g., through the punch holes 4).

Figures 14, 15:
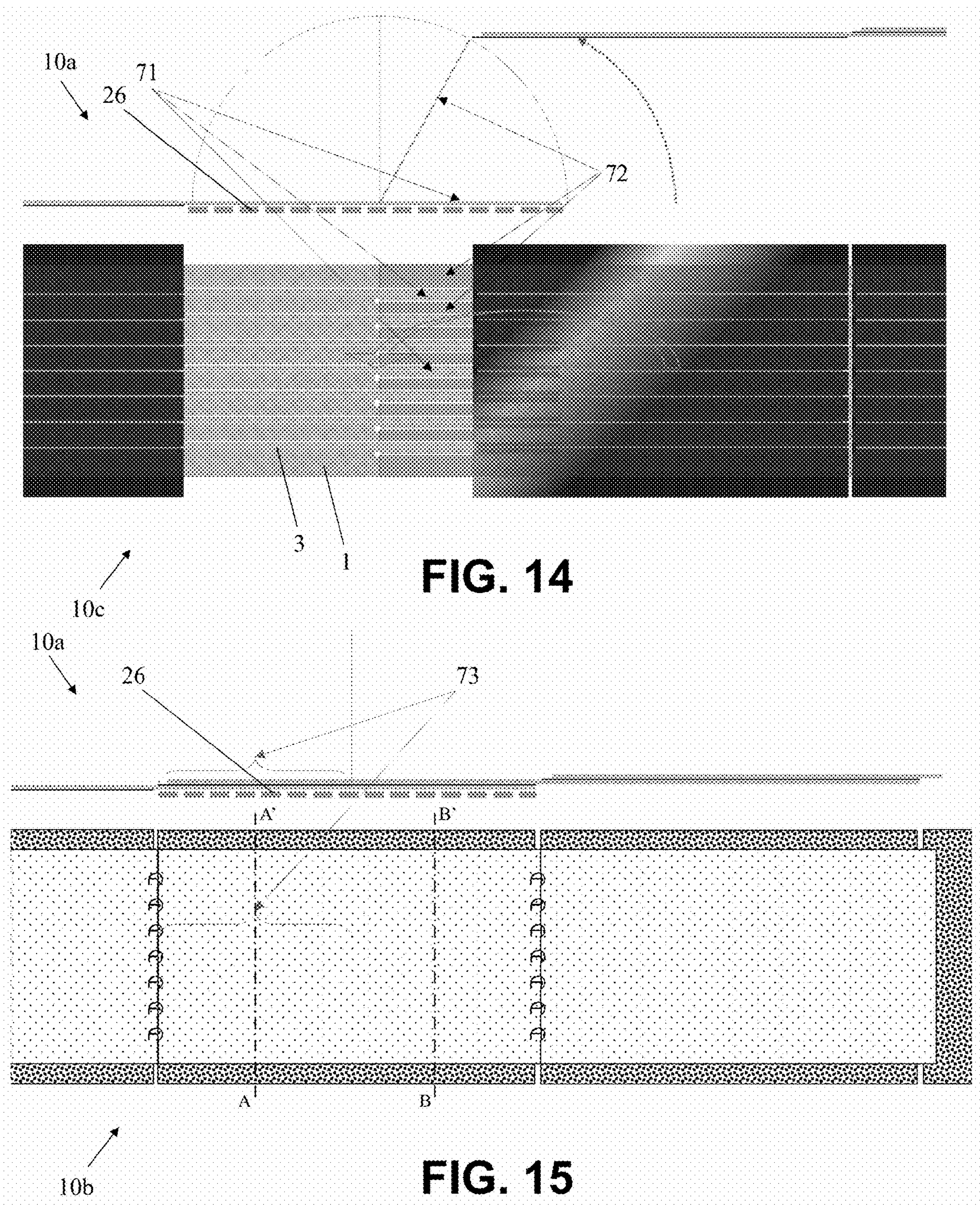
FIG. 14 shows the step of FIG. 13 with further details, according to example embodiments.
FIG. 15 illustrates the step of FIG. 13 with further details, according to example embodiments.

In accordance with FIG. 14, also in this context, as marked by reference sign 71, the respective foil-fingers with electrically conductive wires 3 may be kept down by the vacuum 26, whereas, as marked by reference sign 72, the foil 1 in between the electrically conductive wires 3 (e.g., laterally between the electrically conductive wires 3, such as in a direction perpendicular to the provision direction) may be lifted up. Additionally, as marked by reference sign 73 in FIG. 15, the foil 1 is double-folded between (e.g., at lateral sides of) the electrically conductive wires 3 at the respective backside of the first photovoltaic cell 5*a* after over-folding.

Figures 16, 17:
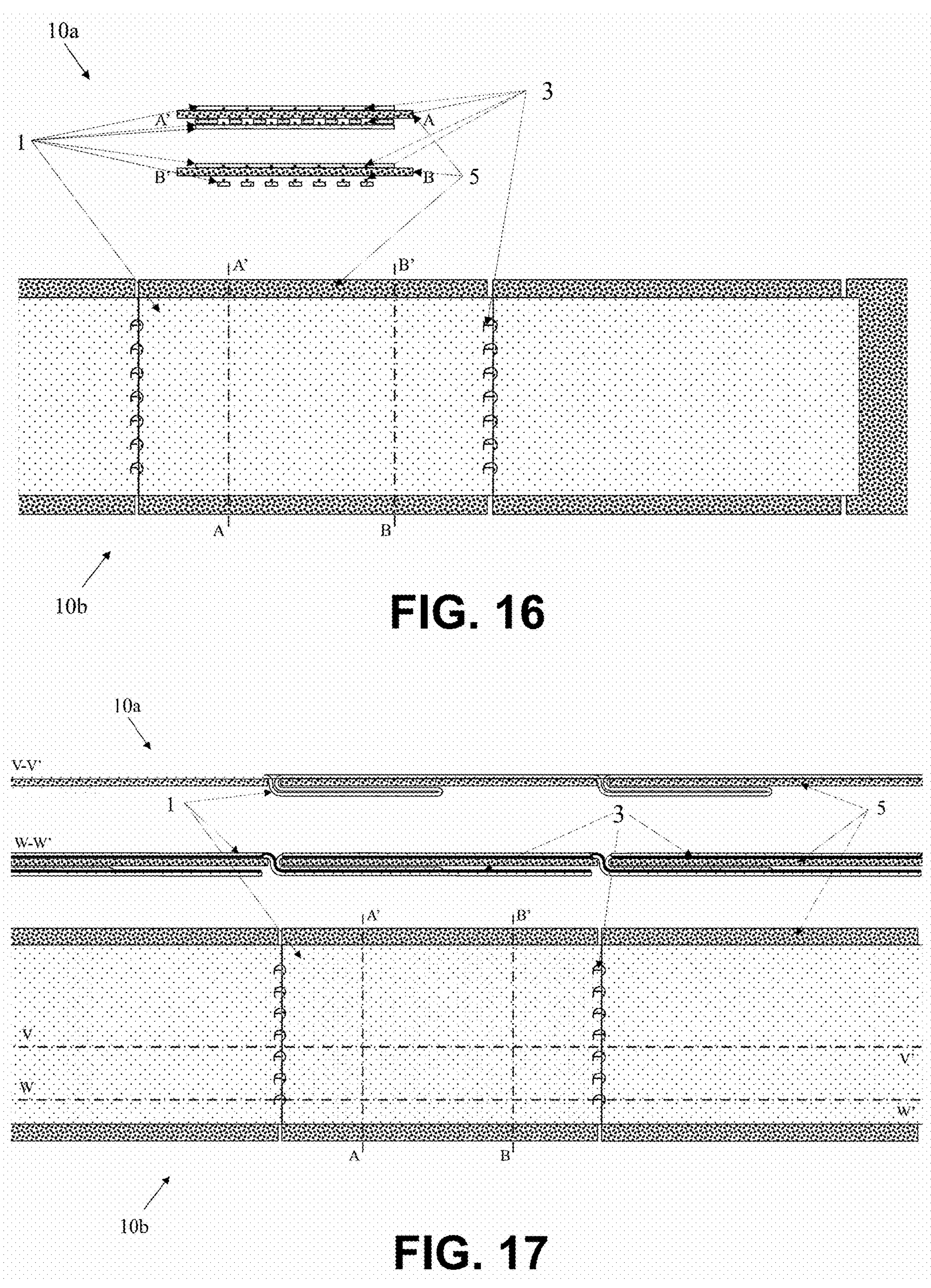
FIG. 16 depicts the step of FIG. 13 with further details, according to example embodiments.
FIG. 17 shows the step of FIG. 13 with further details, according to example embodiments.
Figures 18, 19:
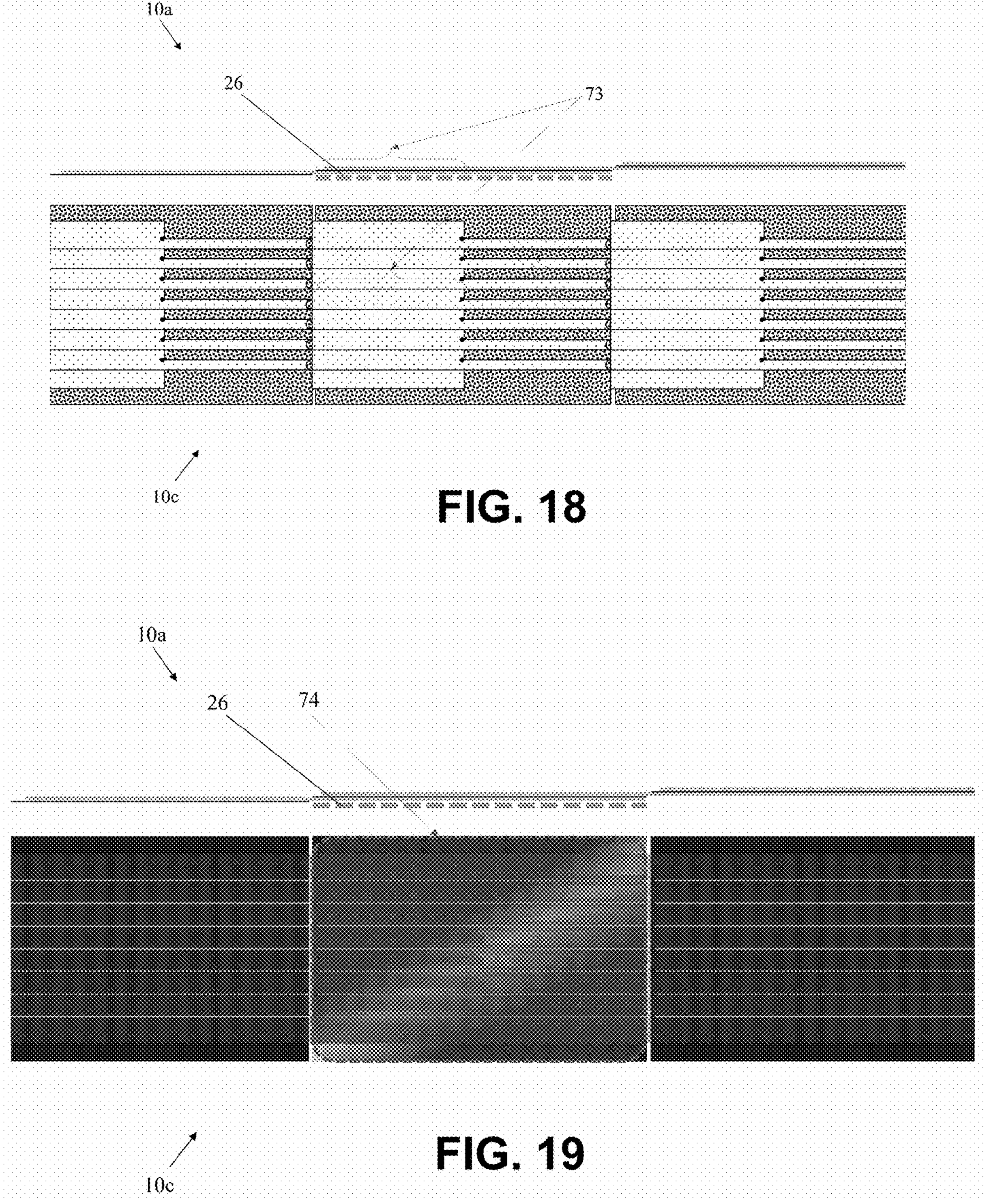
FIG. 18 shows the step of FIG. 13 from a bottom view, according to example embodiments.
FIG. 19 shows a step of a method, according to example embodiments.

This situation is illustrated in more detail in FIG. 16 and FIG. 17 showing different corresponding sectional views, where sections A-A' and B-B' represent sections substantially orthogonal to the provision direction and where sections V-V' and W-W' represent sections substantially parallel to the provision direction. Section A-A' corresponds to a location in area 73 where the foil 1 is double-folded at lateral sides of the electrically conductive wires 3, whereas section B-B' corresponds to a location outside area 73. Section V-V' corresponds to locations laterally in between electrically conductive wires 3 and section W-W' corresponds to locations where electrically conductive wires 3 are present. As can be seen in these cross sections, after the folding step, the electrically insulating foil 1 is present between neighboring photovoltaic cells (e.g., between edges of neighboring photovoltaic cells) such that direct physical contact between neighboring cells is avoided, thereby also avoiding electrical contact between the cells. The foil thus provides electrical edge isolation between neighboring photovoltaic cells. FIG. 18 depicts a corresponding view of the first surface of the foil 1 or a bottom view 10*c* of the foil 1, as well as a side view 10*a*, which also emphasizes that the foil 1 is double-folded between the electrically conductive wires 3 as marked by reference sign 73, more in particular in a region at lateral sides of the electrically conductive wires 3.

Figures 20, 21:
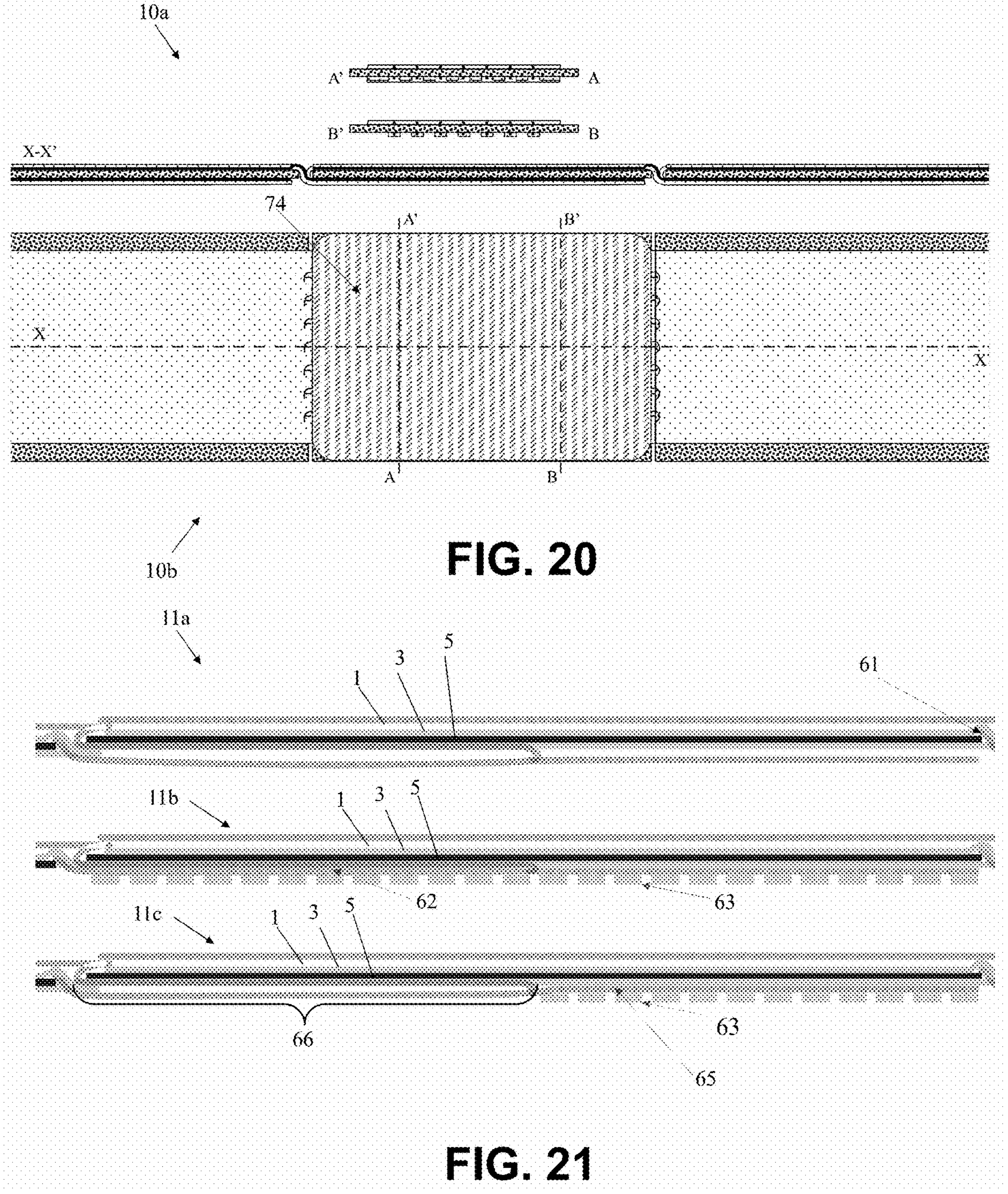
FIG. 20 shows the step of FIG. 19 with further details, according to example embodiments.
FIG. 21 shows details of an interconnected cell, according to example embodiments.

Furthermore (e.g., after the over-folding according to FIG. 13 to FIG. 18), as illustrated by FIG. 19 in the context of a bottom view 10*c* and by FIG. 20 in the context of a top view 10*b*, respectively, the first photovoltaic cell may be attached to the foil 1 by heating the foil 1 in a heating area 74. In the example illustrated in FIG. 19 the heating area 74 covers the full area of the first photovoltaic cell such that the foil 1 adheres to the full respective bottom-side (also rear side or back side) cell area of the first photovoltaic cell.

Thereby the electrically conductive wires 3 within the heating area 74 also adhere to the bottom side (back side, rear side) of the first photovoltaic cell, thus providing an electrical back contact to the first photovoltaic cell. As the electrically conductive wires 3 are also attached to the front side of the second photovoltaic cell and provide an electrical front contact thereto, in this way an electrical series connection is established between the first photovoltaic cell and the second photovoltaic cell. FIG. 20 shows a corresponding top view 10*b* and additionally shows corresponding sectional views for further explanation, where sections A-A' and B-B' represent sections substantially orthogonal to the provision direction and where section X-X' represents a section substantially parallel to the provision direction, more in particular at a location where electrically conductive wires 3 are present.

Continuous photovoltaic cell stringing according to some embodiments may allow for the making of a practically "endless" string of photovoltaic cells that can, for example, be rolled up into a roll from which later on customized strings can be cut, such as for example strings having a custom string length, depending on the envisaged application.

In some embodiments, heating area 74 may be limited to only a part of the area of the first photovoltaic cell, such that the foil 1 does not adhere to the full bottom-side area of the first photovoltaic cell but only to a part of the bottom-side area. In some embodiments, the heating area may be limited to an area outside the region where the foil 1 is double-folded at the back side of the first photovoltaic cell (i.e. outside the region marked by reference sign 73 in FIG. 15 and FIG. 18). As further explained in more detail, such partial heating offers the possibility of string cutting without loss of cells and without loss of cell active area.

String cutting may typically be done in the context of providing electrical connections, such as busbar connections, to a string, where electrical connections are to be made to the front side and/or the back side of the string. These electrical connections can for example be made to a photovoltaic cell that is positioned near the location where the string is cut (string cutting area). This may require accessibility to the electrically conductive wires 3 not only at the front side of the photovoltaic cell but also at the back side of the photovoltaic cell. In some embodiments, such accessibility can be realized by limiting heating of the foil 1 to an area outside the region where the foil 1 is double-folded at the back side of the first photovoltaic cell.

FIG. 21 illustrates details of cell-interconnection. The embodiment illustrated in side view 11*c* may be used in the context of string cutting (e.g., avoiding cell loss at the string cutting area) to allow top- or bottom cell interconnection (e.g., for string bussing).

In accordance with FIG. 21, a side view 11*a* of the cell assembly or a sectional view along the provision direction of the foil, respectively, is shown, which illustrates the situation after over-folding as explained above. In this context, a corresponding edge isolation is marked by reference sign 61.

In addition to this, FIG. 21 depicts a further side view 11*b* after a heating step (e.g., on the full respective cell as explained above or the situation after a lamination in a module stack, respectively). In this context, reference sign 62 marks the double-folded foil between the wires, whereas reference sign 63 marks the heating area which, for example, fully heats the respective backside.

In further addition to this, FIG. 21 shows a further side view 11*c* after a heating step, where the heating area is limited to only a part, for example about half, of the area of the respective cell such as the first photovoltaic cell 5*a* according to FIG. 10. In the example shown, the heating area is more in particular limited to an area outside the region where the foil 1 is double-folded at the back side of the first photovoltaic cell, such that the foil and the electrically conductive wires adhere to the back surface of the first photovoltaic cell only in an area where the foil is not double-folded. In this context, reference sign 66 in FIG. 21 marks a non-heating region or non-heating area, where the foil and the electrically conductive wires are not laminated to or do not adhere to, respectively, the respective cell backside such as the backside of the first photovoltaic cell 5*a* of FIG. 10. This may offer the possibility of cutting the string at a location in the non-heating area 66 where the foil and the electrically conductive wires do not adhere to the first photovoltaic cell, without thereby creating inactive cells and without loss of inactive cell area.

Reference sign 65 in view 11*c* of FIG. 21 marks a heating region or heating area, where the foil-fingers have been laminated with the electrically conductive wires (in other words: where the electrically conductive wires have been attached to the foil) at the backside of the first photovoltaic cell, and where a preliminary electrical contact has been established before between the electrically conductive wires and the back side of the first photovoltaic cell.

The heating step is followed by a string cutting step, where string cutting may be done at a location in the non-heating area 66 where the foil and the electrically conductive wires do not adhere to the first photovoltaic cell.

Figures 24, 25:
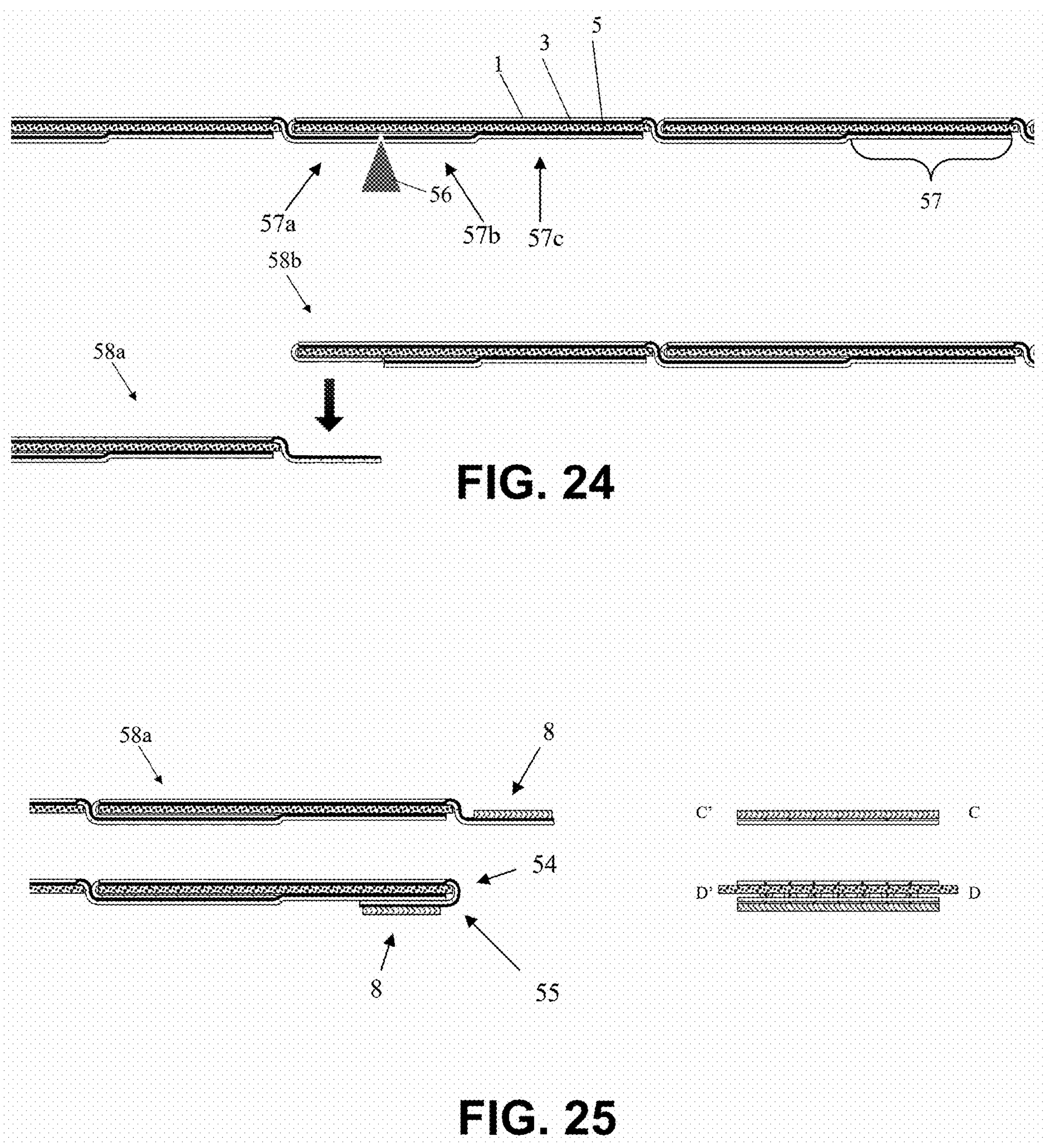
FIG. 24 shows a step of a method, according to example embodiments.
FIG. 25 shows a step of a method, according to example embodiments.

After string cutting, the string is separated into a first string 58*a* (including the second photovoltaic cell at an end of the first string) and a second string 58*b* (including the first photovoltaic cell at an end of the second string), as illustrated in FIG. 24. String cutting can for example be done along a direction substantially orthogonal to the provision direction and for example about in the middle of the non-heating region 66 of the first photovoltaic cell, as schematically indicated by the position of a cutter 56 in FIG. 24.

It is further shown in FIG. 24 that, after string cutting, the first string 58*a* further includes an overhanging part including a stack of the foil 1 and at least one electrically conductive wire 3 attached thereto, the at least one electrically conductive wire 3 being electrically connected to the front side of the second photovoltaic cell. This may enable access to the front side electrical contact of the second photovoltaic cell, for example for electrical connection of a busbar in the context of string bussing. String bussing includes electrical connection of at least one busbar to a string, to thereby enable extraction and collection of an electric current generated by the string upon illumination and/or to further enable electrical connection between at least two strings, for example electrical series connection or electrical parallel connection of strings.

In some embodiments, busbars or busbar ribbons may be provided at the back side of the strings, such that they are invisible from the front side of the strings and such that they do not cause cell or string shadowing (e.g., in case of monofacial cells). Providing busbars or busbar ribbons at the back side of the strings may further allow for a better cell-to-module surface ratio or aperture as compared to approaches where busbars are provided next to the cell strings, for example at an end of the strings. FIG. 25 illustrates an example method for busbar connection, in particular in the context of a first string 58*a* including an overhanging part including a stack of the foil 1 and at least one electrically conductive wire 3 attached thereto and electrically connected to the front side of the end cell of the first string 58*a*. The method illustrated in FIG. 25 includes attaching a busbar ribbon 8 to the at least one electrically conductive wire 3 in the overhanging part and establishing an electrical contact between the busbar ribbon 8 and the at least one electrically conductive wire 3 (and consequently establishing an electrical contact between the busbar ribbon 8 and the front side of the first string 58*a*), followed by flipping the overhanging part over the edge of the end cell towards the cell back side. The result after flipping over is illustrated in the bottom part of FIG. 25.

It is noted that sections C-C' and D-D' shown in FIG. 25 are sections substantially orthogonal to the provision direction at the location of busbar 8, where section C-C' illustrates the situation before flipping over and section D-D' illustrates the situation after flipping over.

As a further result of the flipping process, the edge 54 of the end cell of the first string 58*a* is electrically insulated (e.g., electrically insulated from the electrically conductive wire 3) by the foil 1. Additionally, in a region 55 where the busbar ribbon 8 is positioned after flipping over, a double electrical insulation (double foil 1) is present between the busbar ribbon 8 (front side electrical contact of the end cell) and the electrically conductive wire 3 at the rear side of the end cell (rear side electrical contact of the end cell). Having such a double electrical insulation there in between may be used because of the opposite electrical polarities of both contacts.

With respect to the busbars, it is generally noted that busbars may be metal-based wires or ribbons or foils, as long as the cross-section is sufficient to avoid too many losses (e.g., resistive losses). In some embodiments, the busbars, for example ribbons, may be coated with a low-melting-temperature solder so that a metallurgic bonding of the electrically conductive wires and the busbar is created, for example during the module lamination step. However, a conductive adhesive can be used as well for busbar connection, such as a tape strip or paste. The busbar material can be copper-based or aluminum-based. In the context of CIGS (copper indium gallium (di)selenide) cells, nickel as busbar coating can be considered as well, for example, for direct contact with the cell backside.

With respect to establishing electrical contacts such as the above-mentioned establishing the electrical contact between the busbar ribbon 8 and the at least one electrically conductive wire 3, it is noted that this can, for example, be done by soldering (e.g., with the aid of low-melting-temperature solder), push contact (e.g., with nickel coating), or conductive adhesive such as tape or paste.

Furthermore, FIG. 24 shows that, after string cutting, at the rear side of the end cell of the second string 58*b*, different regions 57*a*, 57*b* and 57*c* can be distinguished:

- in a first region 57*a*, at a first side of the cutting location, the rear side of the end cell is partially covered by the foil 1, without any electrically conductive wires;
- in a second region 57*b*, at another side of the cutting location, the rear side of the cell is covered by a structure including the foil 1 and electrically conductive wires 3 but without an electrical contact between the wires and the cell, as this second region 57*b* is part of non-heating region 66, outside heating region;
- in a third region 57*c* (corresponding to heating region 65), the rear side of the cell is partially covered by a structure including the foil 1 and electrically conductive wires 3, the wires being attached to the rear side of the cell and providing a rear side electrical contact thereto, as a result of the heating step in heating region 65.

This may enable access to the back side electrical contact of the first photovoltaic cell, for example for electrical connection of a busbar in the context of string bussing.

Figures 26, 27:
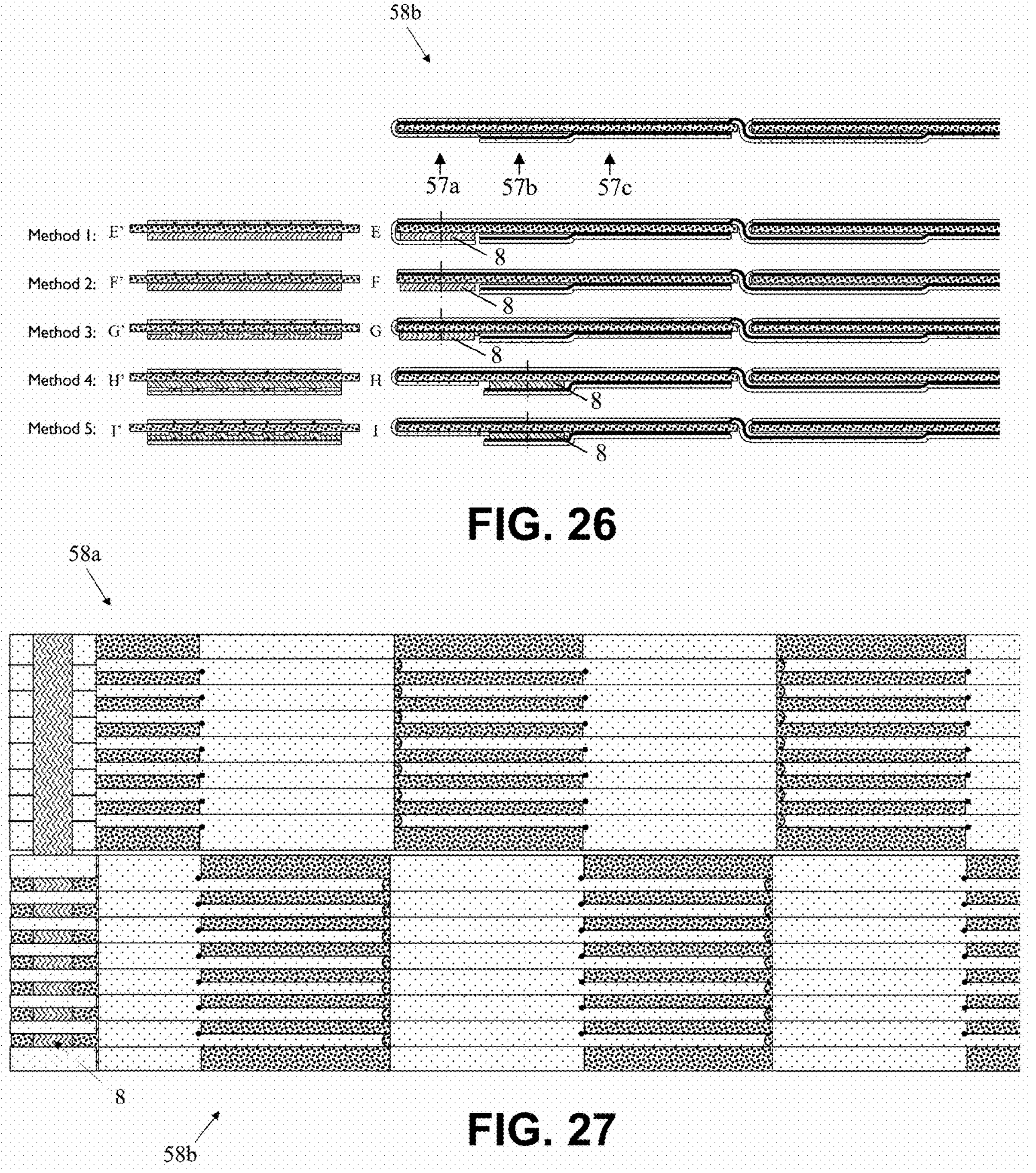
FIG. 26 shows a step of a method, according to example embodiments.
FIG. 27 depicts a cell string interconnection, according to example embodiments.

FIG. 26 illustrates example methods for busbar connection, in particular in the context of a second string 58*b*.

In a first example method (method 1 in FIG. 26) a busbar 8 is electrically connected to the rear side of the first photovoltaic cell in first region 57*a*. This method includes folding the foil 1 from region 57*a* away from the photovoltaic cell to thereby uncover and expose the rear side of the photovoltaic cell in the entire first region 57*a*, next providing a busbar 8 on the rear surface of the photovoltaic cell in first region 57*a* and afterwards folding back the foil 1 towards the rear side of the photovoltaic cell, over the busbar. It is noted that alternatively this method may allow for pre-tacking the busbar, in particular to attach the busbar to the part of the foil 1 folded away from region 57*a* as explained above before folding back the foil (e.g., using the foil remainders) in a pre-lamination heating step.

In a second example method (method 2 in FIG. 26) a busbar 8 is electrically connected to the rear side of the first photovoltaic cell in first region 57*a*. This method includes removing the foil 1 from region 57*a*, for example by cutting it away and thus removing it from the second string 58, to thereby uncover and expose the rear side of the photovoltaic cell in the entire first region 57*a*. Next a busbar 8 is provided on the rear surface of the photovoltaic cell in first region 57*a* and an electrical connection is established.

In a third example method (method 3 in FIG. 26) a busbar 8 is electrically connected to the rear side of the first photovoltaic cell in first region 57*a*. This method includes providing the busbar 8 over the foil 1. As described above, in the first region 57*a* only a part of the photovoltaic cell rear side is covered by the foil and another part is uncovered (i.e. exposed). According to this third example method, an electrical contact is established between the busbar and the rear side contact of the first photovoltaic cell in the uncovered (exposed) parts. In some embodiments, the busbar can be pre-tacked to the cell backside, in particular attached to the cell backside before establishing an electrical contact thereto.

In a fourth example method (method 4 in FIG. 26) a busbar 8 is electrically connected to the rear side of the first photovoltaic cell in second region 57*b*. This method includes folding the foil 1 and the wires 3 from the entire second region 57*b* away from the photovoltaic cell to thereby uncover and expose the rear side of the photovoltaic cell in the entire second region 57*b*, next providing a busbar 8 on the rear surface of the photovoltaic cell in second region 57*b* and afterwards folding back the foil 1 and the wires 3 towards the rear side of the photovoltaic cell, over the busbar. An electrical contact can then be established directly between the rear side of the photovoltaic cell and the busbar ribbon 8 and/or between the folded-back wires 3 (rear side electrical contact of the photovoltaic cell) and the busbar 8. This method might be used if the busbar ribbon coating (solder, metal coating or conductive adhesive) does not allow for a contact with the cell surface or would create too much (thermal) stress on the interconnects between the busbar and the solar cell.

In a fifth example method (method 5 in FIG. 26) a busbar 8 is electrically connected to the rear side of the first photovoltaic cell in second region 57*b*. This method includes folding the foil 1 and the wires 3 away from the second region 57*b* in regions where wires are present and leaving the regions in between the wires (i.e. at lateral sides of the wires, where the foil is double-folded) covered by a single layer of foil, i.e. folding away only one layer of foil in the regions where the foil is double-folded, such that part of the photovoltaic cell rear side remains covered by the foil and another part is uncovered. Next a busbar 8 is provided at the rear side of the photovoltaic cell (over the foil 1 partially covering the rear side. An electrical contact can then established between the busbar and the rear side contact of the first photovoltaic cell in the uncovered (exposed) parts and/or between the folded-back wires 3 and the busbar 8.

The method for continuous cell stringing may enable access to the respective top- or bottom side cell contact of the photovoltaic cells near the cell string cutting area. This can, for example, be achieved with the aid of the above-mentioned partial lamination of the film at the back as explained in the context of the side view 11*c* of FIG. 21, allowing the string to be cut at the back of a cell and still have access to the cell contact at the bottom of that cell, and the cell contact at the top of the neighboring cell of the other part of the cut string. In some embodiments, cell loss or creation of inactive cells, respectively, on the ends of the cut strings may be avoided.

Figures 22, 23:
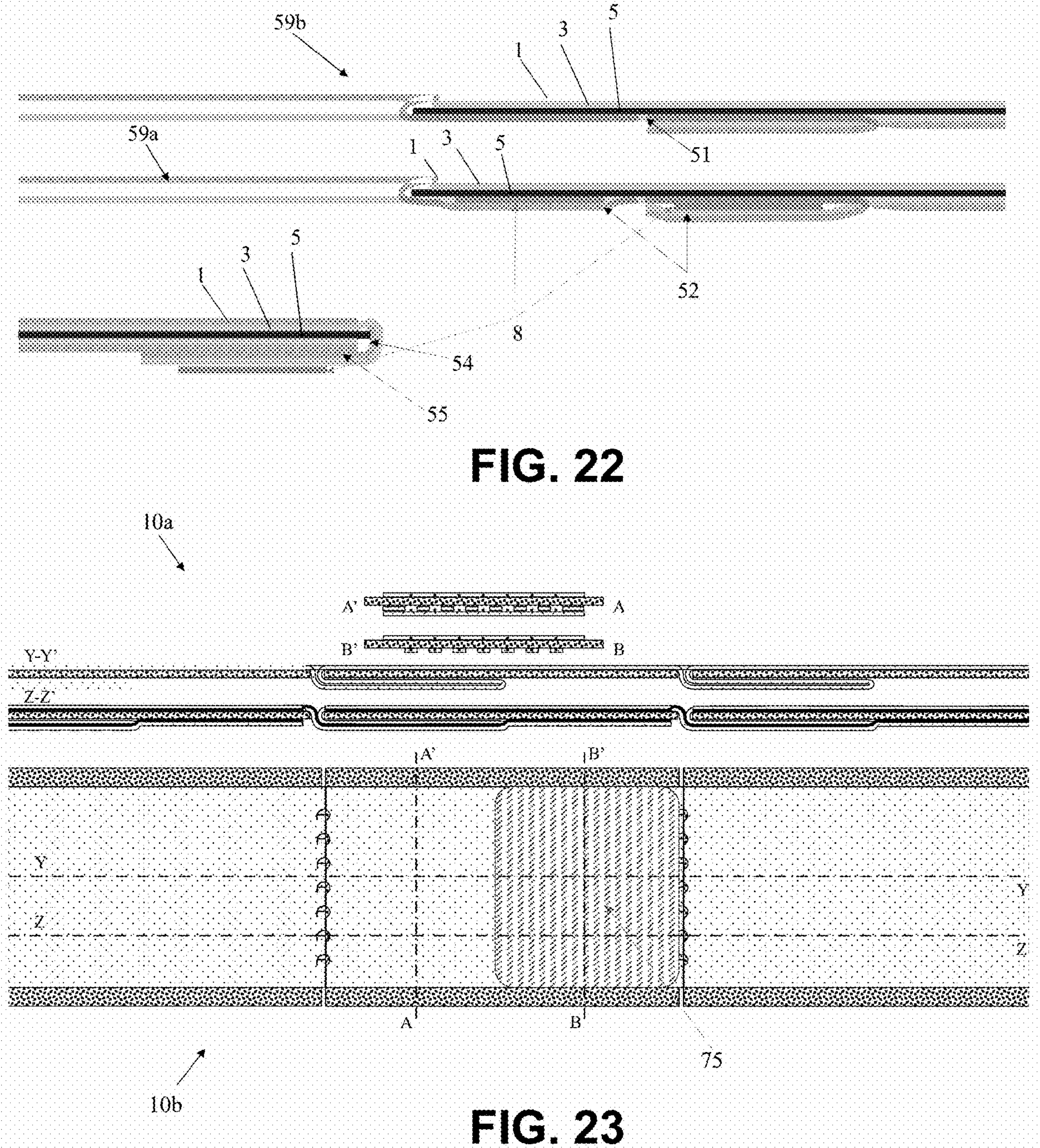
FIG. 22 illustrates string cutting and bussing of strings, according to example embodiments.
FIG. 23 shows a step of a method, according to example embodiments.

Now, with respect to FIG. 22, example busbar contacting and finishing or busbar ribbon placement, respectively, is shown in the context of string cutting and bussing of strings in the sense of example embodiments. Busbars or busbar ribbons may be provided at the respective backside of the cells (back side of the strings), such that they are invisible from the front side of the strings and such that they do not cause cell or string shadowing. According to FIG. 22, part of a first string 59*a* is shown, in particular an end cell of a first string 59*a*, where a top cell contact of the end cell is connected to a string busbar. In this context, the respective string busbar for string bussing is marked with reference sign 8. Additionally, first string 59*a* may include insulated cell edge 54 and a region 55 being double insulated (e.g., with opposite polarities).

Furthermore, FIG. 22 further depicts a second string 59*b* including bottom cell contact to the string busbar 8 in the context of a case, where a foil cut was done as marked by reference sign 51, and in the context of a case, where a foil end was not laminated as explained in the context of view 11 c of FIG. 21, so the foil can be folded back to add busbar ribbon as marked by reference sign 52. With respect to busbar contacting and finishing, it is generally noted that the contacting can be done at the respective backside of the foil. In this context, the respective cell backside between foil fingers can be contacted.

Among the methods described above in the context of FIG. 26, methods 1, 2 and 4 may lead to, for instance, a better contact between the busbar 8 and the rear side of the first photovoltaic cell as compared to methods 3 and 5. As a further alternative, all foil fingers can be cut away (e.g., for direct access to the respective cell backside).

Now, with respect to FIG. 23, a further example step in the context of the method is shown, where the heating area 75 is configured such that the foil-fingers with the electrically conductive wires adhere to the respective cell backside only in a part of the cell area, for example about half of the area of the cell. Additionally, for further illustration, FIG. 23 also depicts different corresponding sectional views.

Furthermore, FIG. 24 illustrates example cutting of a cell string at a desired place (e.g., at the backside of the respective cell in a non-laminated area of the foil). In this context (e.g., for string cutting), the cutter 56 is used. The respective cutting line may be in the middle of the corresponding non-laminated backside area. In some embodiments, only the foil and electrically conductive wires are cut, not the cell. Additionally, reference sign 57*c* marks a region, where the foil-fingers with electrically conductive wires are laminated to the backside of the respective cell.

As it can further be seen form FIG. 24, the respective string parts can be separated into a first string 58*a* and a second string 58*b*.

In accordance with FIG. 25, within the scope of busbar contacting and finishing, foil flipping can be applied with respect to the first string 58*a* (e.g., including top cell contact to the string busbar).

Moreover, FIG. 26 illustrates different methods in the context of foil flipping with respect to the second string 58*b* (e.g., including backside cell contact to the string busbar).

As it can further be seen from FIG. 27 referring to an example cell string interconnection via busbars 8, a backside view of the first string 58*a* and of the second string 58*b* in the context of method 1 of FIG. 26 is illustrated, where the front side contact of the string 58*a* is folded to the corresponding backside.

Figures 28, 29:
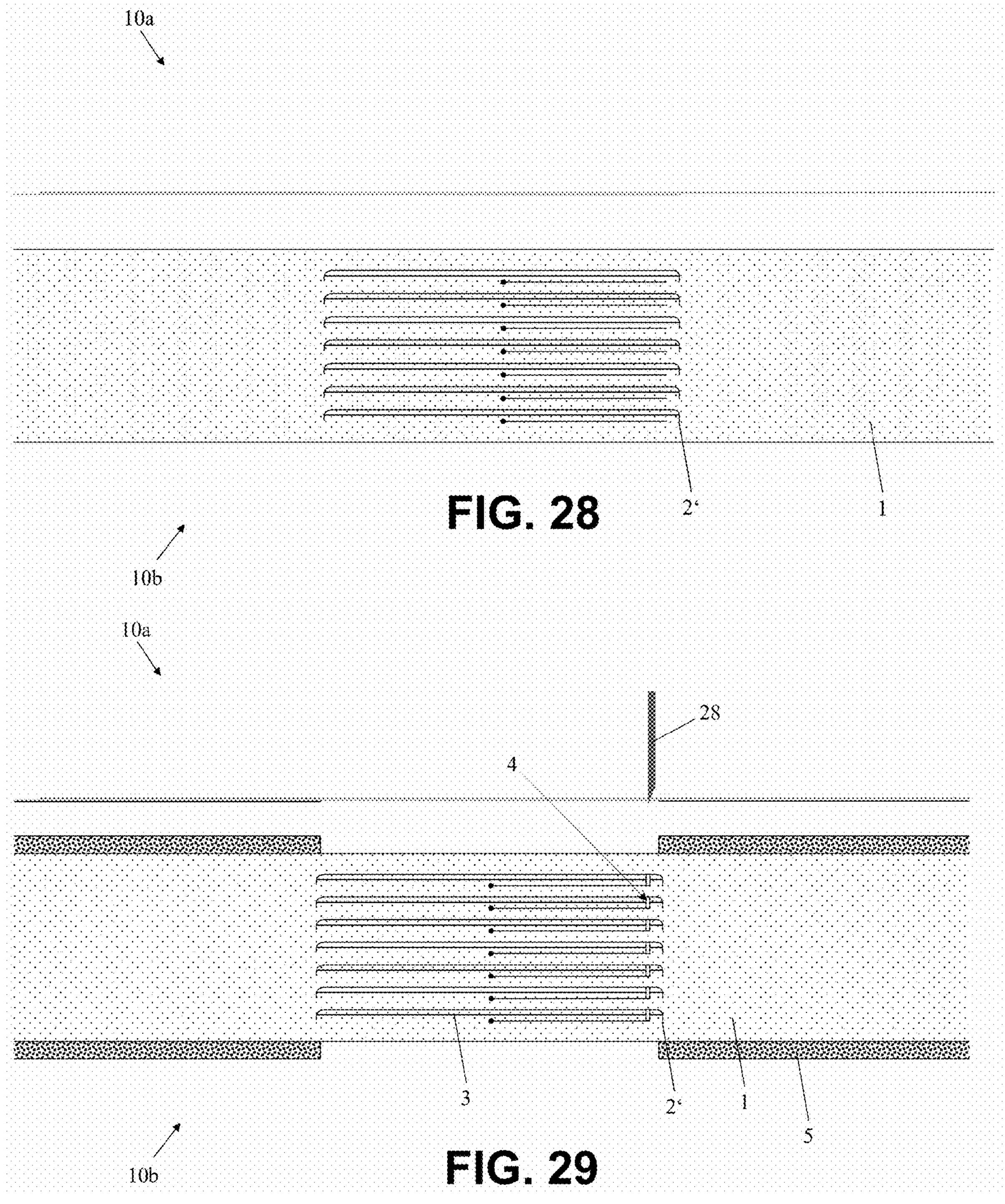
FIG. 28 illustrates a step of a method, according to example embodiments.
FIG. 29 shows a step of a method, according to example embodiments.

Furthermore, FIG. 28 illustrates a further example step (e.g., before electrically conductive wire interruption), such as in the context of diode implementation (e.g., bypass diode implementation). In this context, the cutting pattern may be changed as marked by reference sign 2'. As it can be seen, changed cutting pattern 2' is based on the above-mentioned cutting pattern 2, where the foil-fingers may not be fully cut in the region of the corresponding fingertips.

In another step, in accordance with FIG. 29, with the aid of a punch cutter 28, punch holes 4 or perforations, respectively, are made through the electrically conductive wires 3 and through the foil 1 (e.g., in the region of the fingertips of the foil-fingers cut into the foil 1, thereby interrupting the electrically conductive wires 3).

Figures 30, 31:
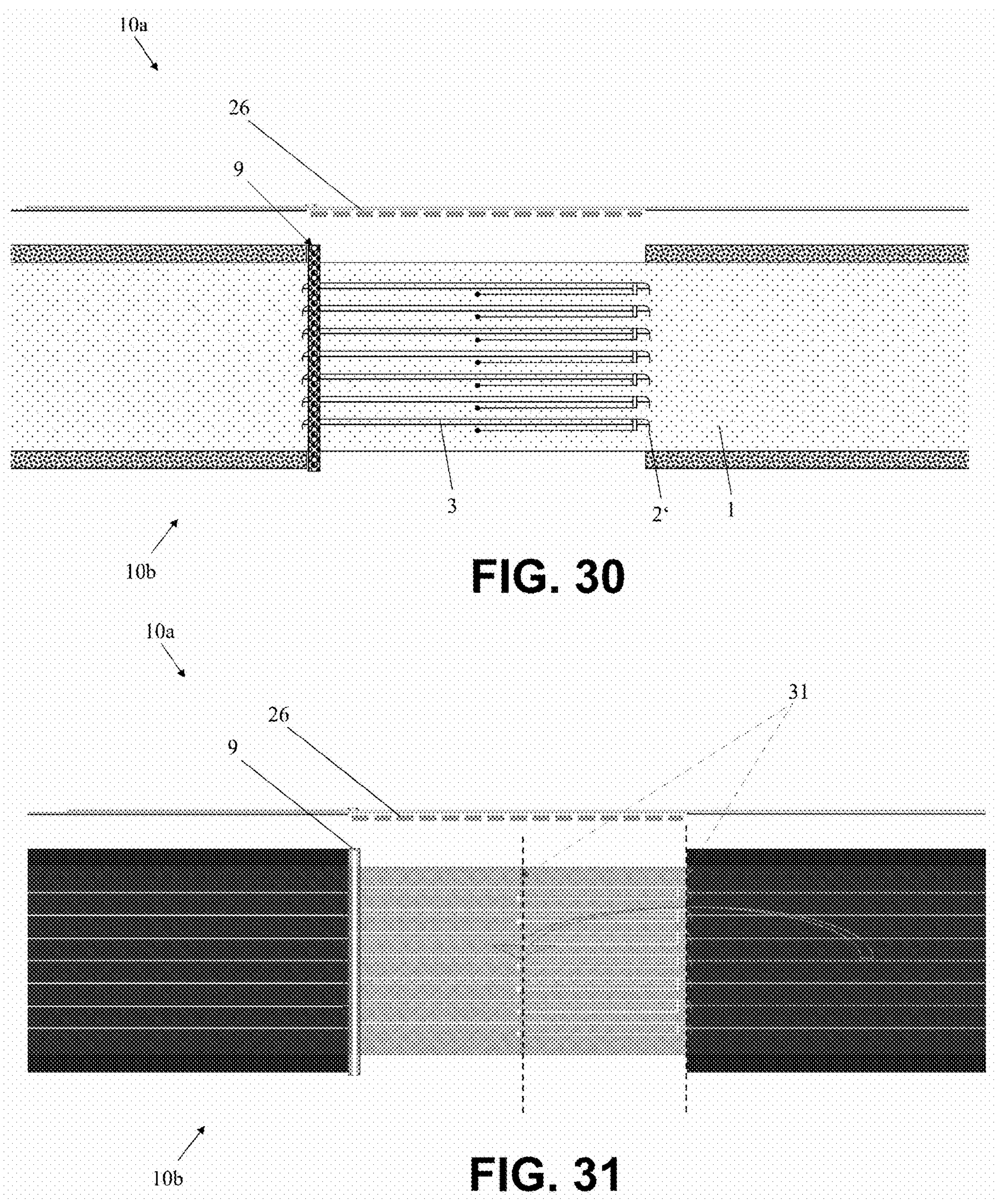
FIG. 30 shows a step of a method, according to example embodiments.
FIG. 31 depicts a step of a method, according to example embodiments.

According to FIG. 30, in another step within the scope of diode implementation (e.g., after the step of arranging the at least two photovoltaic cells on the foil), whereas the foil 1 may be kept down with the aid of a vacuum 26 (e.g., a bottom-side belt vacuum), such as in the region of the changed cutting pattern 2', a bypass diode strip 9 (e.g., a thin-film diode strip with top and bottom contact) is placed (e.g., in the region of an edge of the changed cutting pattern 2', in some cases, without punch holes 4) (i.e., in the second edge region of the cutting pattern).

Moreover, in a further step (e.g., after diode strip placing), over-folding may be performed in an analogous manner to the over-folding as already described above. During over-folding a part of the foil 1 is kept down and held in place with the aid of a vacuum 26 (e.g., a bottom-side belt vacuum), such as in the regions of the changed cutting pattern 2' where the wires 3 are attached to the foil 1. In this context, the corresponding folding lines are marked by reference sign 31 of FIG. 31.

Figures 32, 33:
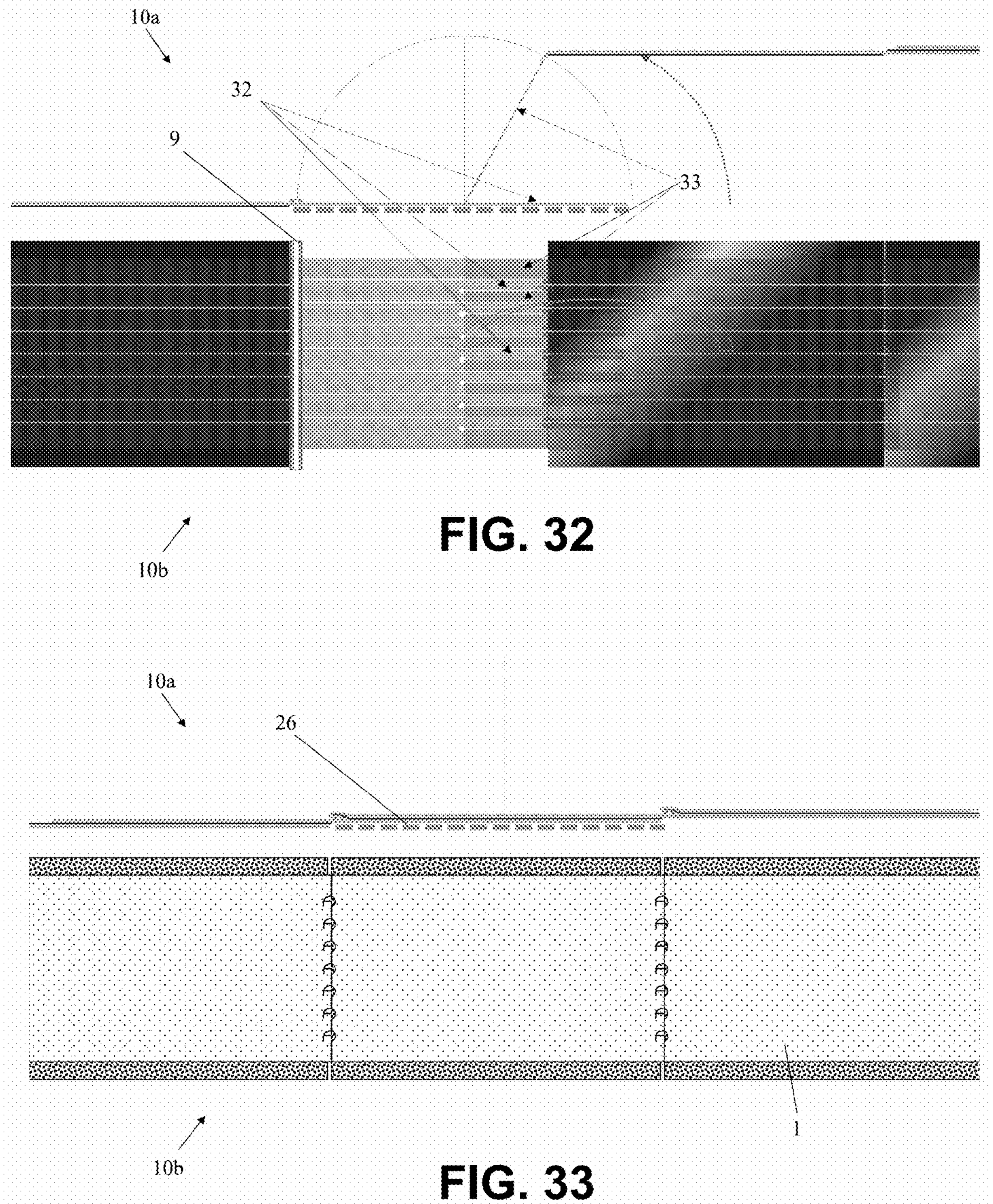
FIG. 32 shows a step of a method, according to example embodiments.
FIG. 33 shows a step of a method, according to example embodiments.

In addition to this, reference sign 32 of FIG. 32 marks areas, where the foil with electrically conductive wires is kept down by the vacuum 26, whereas reference sign 33 of FIG. 32 marks areas, where the foil in between the electrically conductive wires is lifted up.

Figures 34, 35:
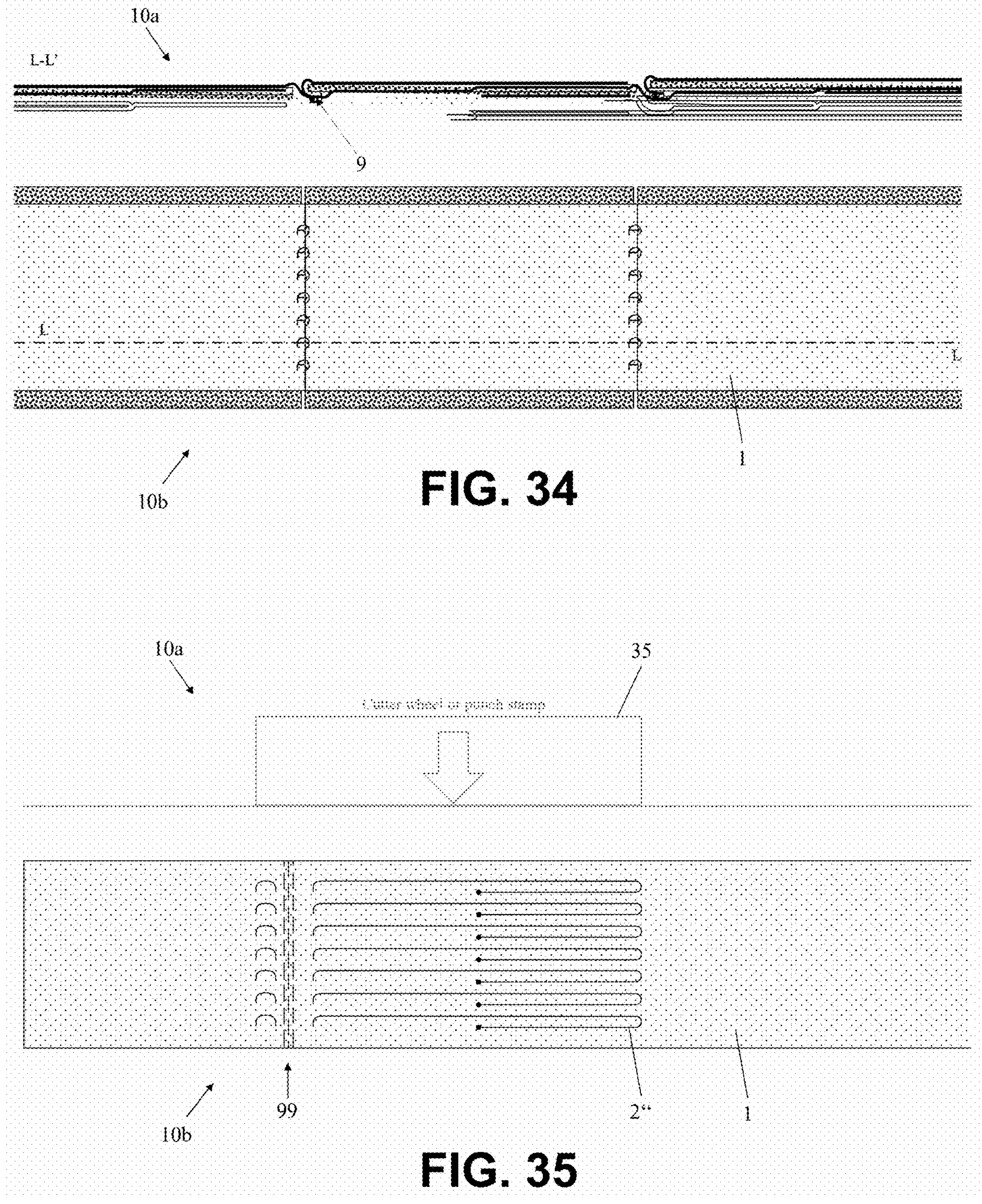
FIG. 34 illustrates a step of a method, according to example embodiments.
FIG. 35 shows a step of a method, according to example embodiments.

Furthermore, for further illustration, FIG. 33 or FIG. 34, respectively, show the situation (e.g., after over-folding within the scope of simultaneously top contacting of the diode or diode strip). Additionally, FIG. 34 illustrates a sectional view including diode strip 9 along the provision direction.

Now, with aid of FIG. 35 to FIG. 43, an additional option to create flexible and at least partially stretchable cell strings in the sense of example embodiments is illustrated. The additional option might be used in the context of avoiding and compensating for undesired effects (e.g., stress effects) that may be caused (e.g., during and/or after manufacturing) by differences in coefficient of thermal expansion between different materials in a cell and/or a string and/or in a module.

In accordance with FIG. 35, an adapted cutting pattern 2" is applied to the foil 1 with the aid of a cutter wheel or punch stamp 35.

Figures 36, 37:
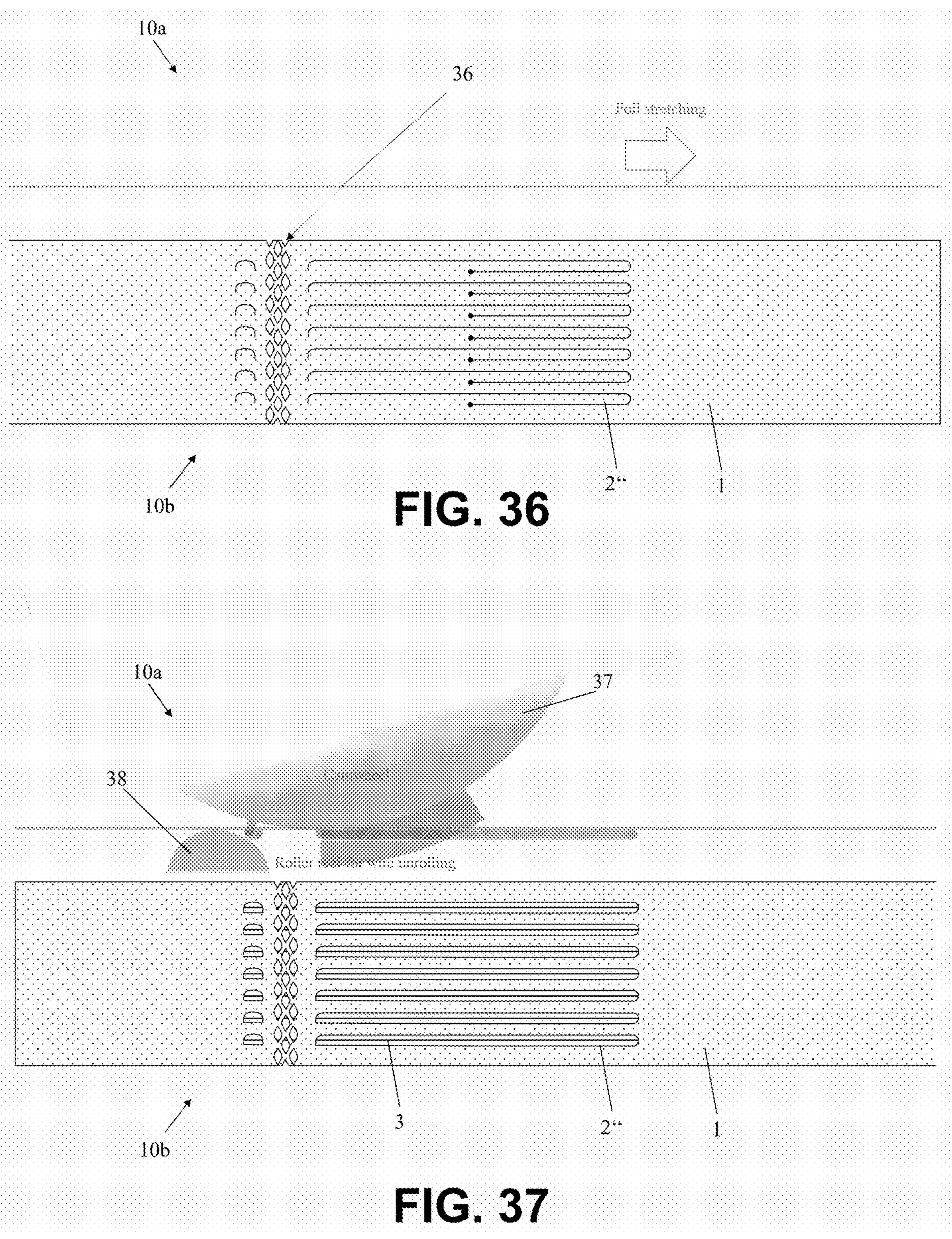
FIG. 36 shows a step of a method, according to example embodiments.
FIG. 37 shows a step of a method, according to example embodiments.

Adapted cutting pattern 2" may include a region 99 being configured such that the resulting foil structure after stretching resembles that of an expanded sheet (e.g., like an expanded metal sheet) as marked by reference sign 36 of FIG. 36. As it can also be seen from FIG. 36, foil stretching may be performed in and/or against the provision direction. The foil stretching may lead to local expanded foil areas.

In this context, the foil in the expanded foil region may be elastically (so not plastically) deformed during stretching so that it can take its original shape after later releasing of the foil.

Moreover, according to FIG. 37, in another step (e.g., after the foil stretching), foil lifting and addition of electrically conductive wires 3 may be performed in an analogous manner to one as already described above without stretching. In this context, a camwheel 37 may be used for folding open the foil at the location of the slits of adapted cutting pattern 2", whereas a roller reel 38 may be used for electrically conductive wire unrolling.

Figures 38, 39:
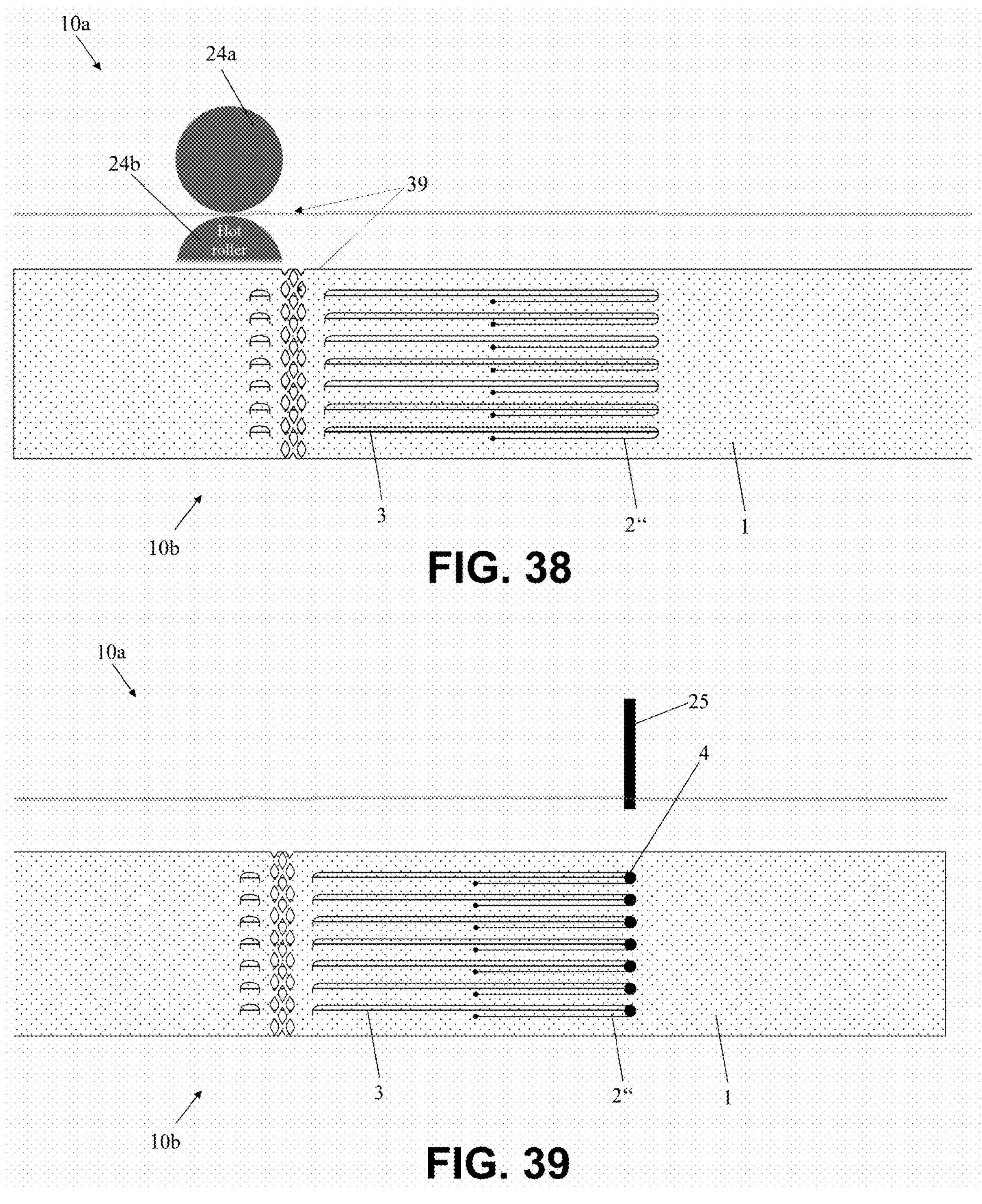
FIG. 38 shows a step of a method, according to example embodiments.
FIG. 39 shows a step of a method, according to example embodiments.

In accordance with FIG. 38, in another step, the foil 1 is heated (e.g., melted on the electrically conductive wires 3), but may not be melted (e.g., just heated to make it sticky such that the electrically conductive wires 3 are attached to the foil 1, with the aid of hot rollers 24*a*, 24*b*). In addition to this, reference sign 39 of FIG. 38 marks areas, where the electrically conductive wires are laminated at the respective bottom side of the expanded foil region.

In another step according to FIG. 39, by analogy with FIG. 7, electrically conductive wire interruption and foil punching are performed with the aid of a punch stamp 25.

Figures 40, 41:
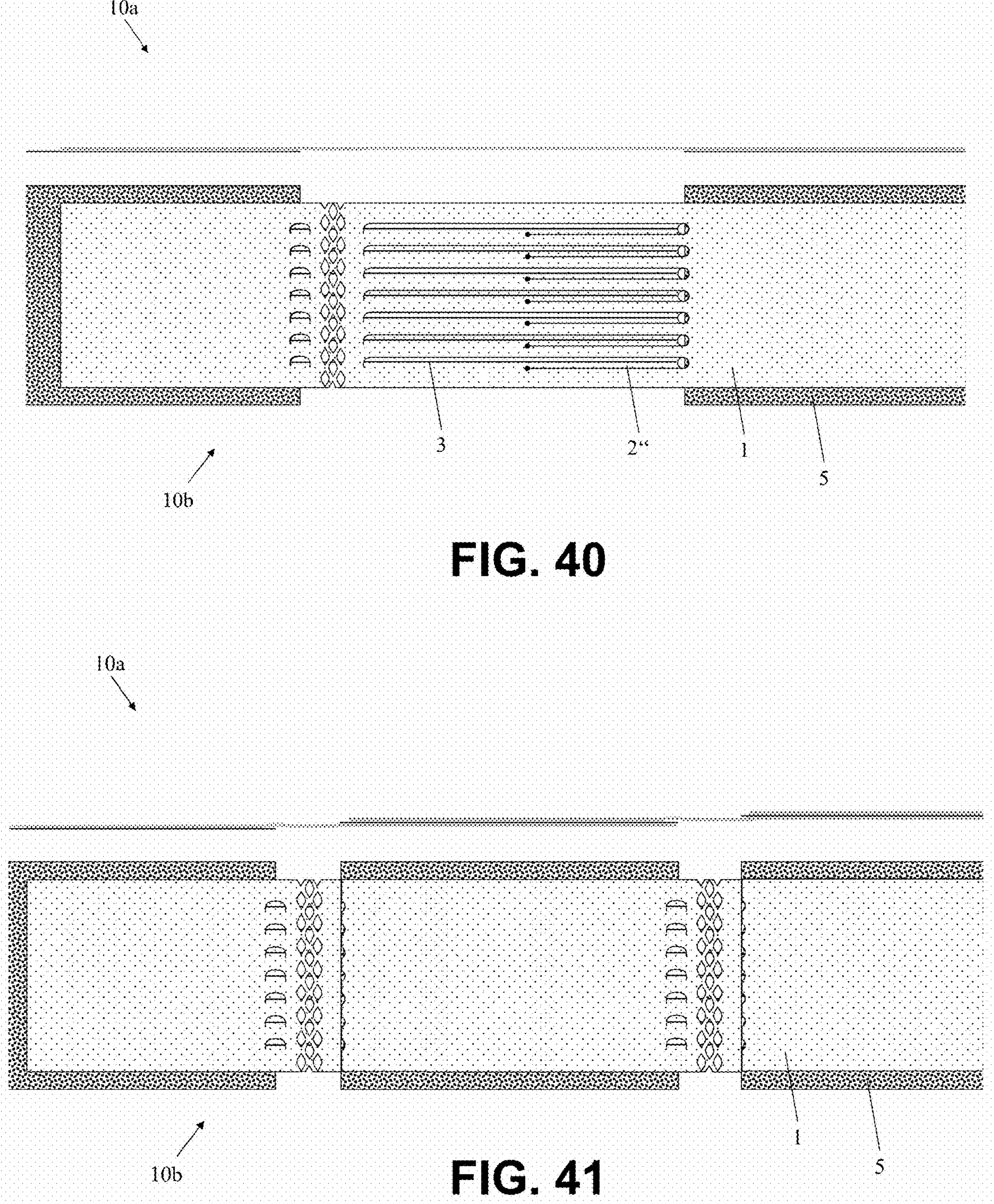
FIG. 40 illustrates a step of a method, according to example embodiments.
FIG. 41 depicts a step of a method, according to example embodiments.

Furthermore, by analogy with FIG. 10, cell lamination can be performed in another step according to FIG. 40 (e.g., after the wire interruption).

Moreover (e.g., by analogy with the over-folding as already described above), cell/foil over-folding can be performed (e.g., after the cell lamination of FIG. 40, the result of which is illustrated by FIG. 41).

Figures 42, 43:
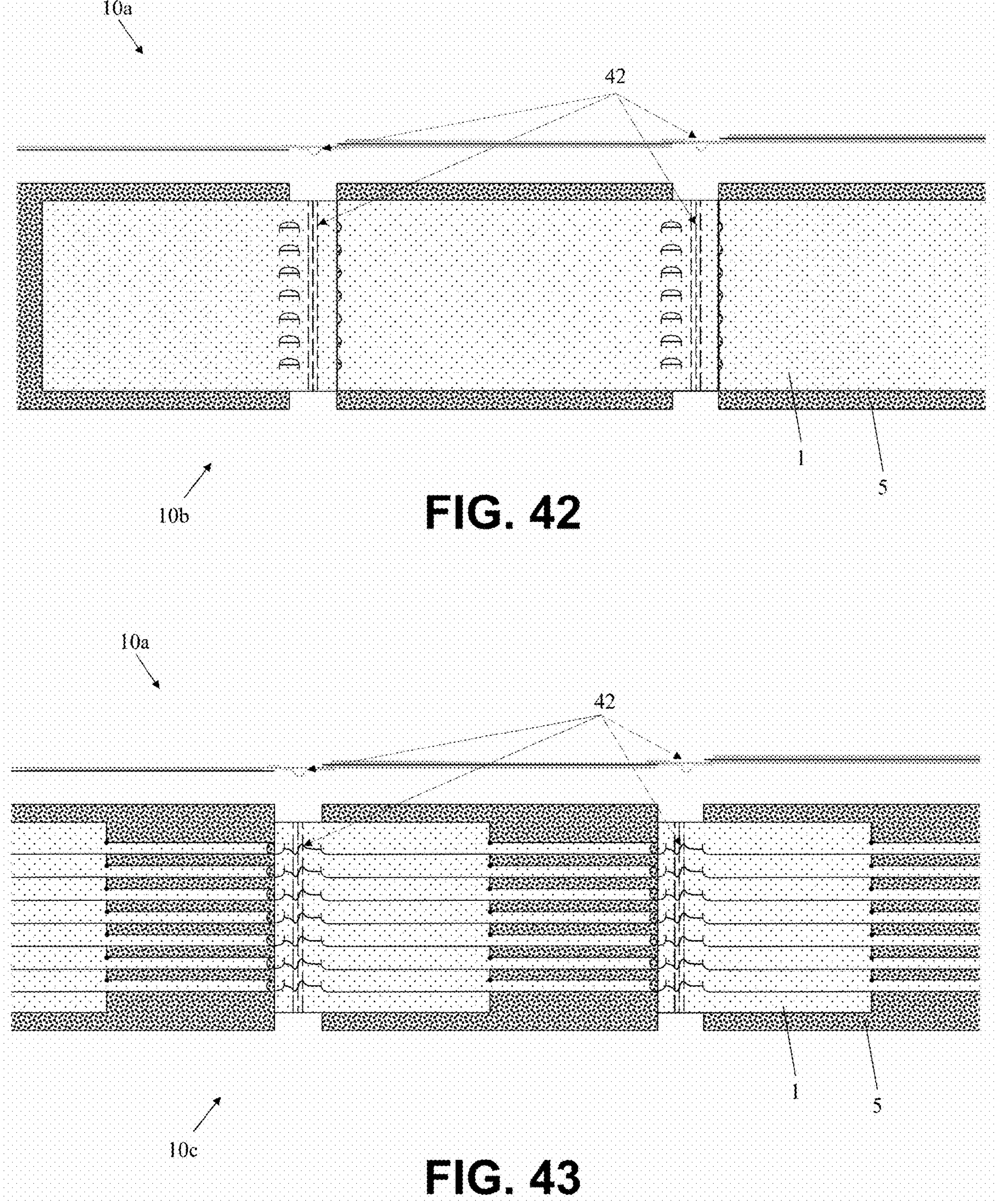
FIG. 42 shows a step of a method, according to example embodiments.
FIG. 43 illustrates a step of a method, according to example embodiments.

In some embodiments (e.g., after over-folding), in accordance with FIG. 42, foil detensioning or foil release, respectively, is performed. In this context, reference sign 42 marks areas, where the electrically conductive wire section at the previously expanded foil section folds or straps together, respectively. Accordingly, the foil relaxes and returns to its original shape.

Furthermore, in addition to this, FIG. 43 illustrates a view of the first surface with respect to the foil 1 or a bottom view 10*c*, respectively.

Finally (e.g., with respect to the method having been illustrated in the context of producing a photovoltaic cell assembly in accordance with FIG. 2 to FIG. 43), the substantial character of the method is summarized in a nutshell in the following example. In this context, the method can be seen as a continuous process, for instance, with a vacuum conveyer. Firstly, the foil is unrolled on a belt. The foil may be a foil with a high melting point and an adhesive layer with a low melting point on both sides. Then, the foil is perforated. For instance, a cutting wheel presses a cutting pattern into the foil. In some embodiments, there is no interruption in the speed of the conveyor belt.

Furthermore, the respective slit is lifted by, for example, a cam wheel. Additionally, the at least one electrically conductive wire (e.g., multiple electrically conductive wires), are unrolled (e.g., parallel to the progress of the conveyor belt) from the underside of the foil. As the foil progresses, the slit opening is folded back. Moreover, the electrically conductive wires adhere to the foil by running the conveyor with the foil and wires through a set of hot pressure rollers. Then, the electrically conductive wires in the foil are interrupted, for instance, with the aid of a punching stamp.

Furthermore, placement of the cells on one side and adhesion to the foil are performed, for instance, with the aid of a short heating step about 100 degrees Celsius to adhere the cells to the foil (e.g., with one cell spacing and an additional spacing between cells, if needed). Moreover, folding or over-folding, respectively, of cell and foil is performed. In this context, the foil structure may keep the electrically conductive wire flat on the conveyor belt during the folding process, and contactable from the top. The cell position may be secured by a short heating step to about 100 degrees Celsius.

In some embodiments, as it can be seen, example embodiments combine foil, electrically conductive wires, and cells in one process, reducing alignment steps to an absolute minimum, in a continuous moving process on a conveyor belt. In addition, example embodiments allow for the addition of diodes per cell or a series of cells, and solar cell edge protection to prevent short circuits or electrical shunts at the cell edge with the electrically conductive wires running from cell to cell.

With general respect to FIG. 2 to FIG. 43, it is noted that the figures show a process with cell placement on the bottom and electrically conductive wire placement on the top, but this process can be reversed if it is feasible/convenient.

The process also allows for the integration of bypass diodes between two adjacent cells. Important to note is the ability to protect the edges of the cells by the foil, which is determined by the cutting pattern during the embossing step. During over-folding, the alignment of the cell may be determined by the cutting pattern, which is already correctly positioned relative to the cells during the cell placement step.

Furthermore, the figures also detail the possibility to cut the continuous cell string, with the ability to gain access to both polarities of the outer cells of the cut string and potential schemes for the placement of the busbars. Further, as already explained above, example embodiments may also allow for the creation of stretchable cell strings.

While various example embodiments have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope should be defined in accordance with the following claims and their equivalents.

Although embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired for any given or particular application.

What is claimed is:

1. A method for continuous photovoltaic cell stringing, the method comprising:

providing a foil in a provision direction in a continuous manner;

cutting at least one slit into the foil along the provision direction;

creating at least one slit opening by folding open the foil at a location of the at least one slit;

providing at least one electrically conductive wire near a first surface of the foil along the provision direction aligned with the at least one slit opening in a continuous manner;

folding back the foil at the at least one slit opening after the electrically conductive wire provision such that the at least one electrically conductive wire changes its position from the first surface to a second surface being opposite to the first surface of the foil in a region of the at least one slit opening, thereby closing the at least one slit opening while maintaining the at least one slit;

attaching the at least one electrically conductive wire to the first surface of the foil;

forming at least one perforation through the at least one electrically conductive wire and through the foil in a first edge region of the at least one slit, thereby interrupting the at least one electrically conductive wire in the first edge region of the at least one slit;

arranging at least two photovoltaic cells on the first surface of the foil such that:

an edge region of a first one of the at least two photovoltaic cells overlaps part of the at least one perforation formed at the first edge region of the at least one slit; and an edge region of a second one of the at least two photovoltaic cells overlaps a second edge region of the at least one slit; and attaching the at least two photovoltaic cells to the first surface of the foil.

2. The method according to claim 1, wherein:

the foil comprises a basic layer and two sandwich layers sandwiching the basic layer;

cutting the at least one slit into the foil comprises utilizing a cutter wheel, a punch stamp, or a laser;

creating the at least one slit opening comprises utilizing at least one cam wheel for folding open the foil; or the electrically conductive wire provision comprises utilizing at least one roller reel for unrolling the at least one electrically conductive wire.

3. The method according to claim 2, wherein the two sandwich layers have a lower melting point than a melting point of the basic layer.

4. The method according to claim 1, wherein attaching the at least one electrically conductive wire to the first surface of the foil comprises heating the at least one electrically conductive wire.

5. The method according to claim 2, wherein attaching the at least one electrically conductive wire to the first surface of the foil comprises:

heating the foil at least in a region of the at least one electrically conductive wire;

melting the foil at least in the region of the at least one electrically conductive wire; or heating the foil at least in the region of the at least one electrically conductive wire to a temperature lower than a melting temperature of the foil, wherein the temperature lower than the melting temperature of the foil is lower than a melting temperature of the two sandwich layers.

6. The method according to claim 5, wherein:

heating the foil comprises heating to a temperature such that the at least one electrically conductive wire adheres to the foil; or attaching the at least one electrically conductive wire to the first surface of the foil comprises utilizing at least one hot roller or an energy source for heating the at least one electrically conductive wire.

7. The method according to claim 1, wherein attaching the at least one electrically conductive wire to the foil comprises Joule heating the at least one electrically conductive wire.

8. The method according to claim 1, wherein forming the at least one perforation comprises utilizing a punch stamp or a laser.

9. The method according to claim 1, further comprising arranging an electrically conductive sheet on the foil such that a first edge region of the electrically conductive sheet overlaps part of the at least one perforation and a second, opposite, edge region of the electrically conductive sheet overlaps the first edge region of the at least one slit.

10. The method according to claim 9, wherein the electrically conductive sheet or the foil is stretchable.

11. The method according to claim 1, wherein arranging the at least two photovoltaic cells on the first surface of the foil results in a substantial region of the at least one slit not being covered with any of the at least two photovoltaic cells.

12. The method according to claim 1, wherein the at least two photovoltaic cells are attached to the first surface of the foil by:

heating the foil at least in the region of the at least two photovoltaic cells;

melting the foil at least in the region of the at least two photovoltaic cells; or heating the foil at least in the region of the at least two photovoltaic cells to a temperature such that the at least two photovoltaic cells adhere to the foil.

13. The method according to claim 1, further comprising:

folding the first one of the at least two photovoltaic cells over a substantial region of the at least one slit such that:

the first one and the second one of the at least two photovoltaic cells do not overlap with respect to each other; and the foil is double-folded; and attaching the first one of the at least two photovoltaic cells to the foil in the substantial region of the at least one slit.

14. The method according to claim 13, wherein folding the first one of the at least two photovoltaic cells over the substantial region of the at least one slit comprises holding at least a part of the foil in place in the region of the at least one slit by a vacuum.

15. The method according to claim 1, further comprising arranging at least one diode, at least one thin-film diode, or a thin-film diode strip in the second edge region of the at least one slit.

16. The method according to claim 1, further comprising stretching the foil in the provision direction in order to create at least one local expanded foil area in an edge region of the at least one slit.

17. The method for continuous photovoltaic stringing according to claim 1, wherein the at least two photovoltaic cells are chalcogenide photovoltaic cells, silicon photovoltaic cells, perovskite photovoltaic cells, organic photovoltaic cells, or amorphous silicon photovoltaic cells.

18. The method according to claim 1, further comprising cutting a string of photovoltaic cells to form a first string of photovoltaic cells and a second string of photovoltaic cells, wherein the first string of photovoltaic cells or the second string of photovoltaic cells includes an overhang region.

19. The method according to claim 18, further comprising electrically connecting a busbar ribbon to a wire section of the at least one electrically conductive wire, wherein the wire section is located in the overhang region.

20. A photovoltaic cell assembly fabricated by a method comprising:

providing a foil in a provision direction in a continuous manner;

cutting at least one slit into the foil along the provision direction;

creating at least one slit opening by folding open the foil at a location of the at least one slit;

providing at least one electrically conductive wire near a first surface of the foil along the provision direction aligned with the at least one slit opening in a continuous manner;

folding back the foil at the at least one slit opening after the electrically conductive wire provision such that the at least one electrically conductive wire changes its position from the first surface to a second surface being opposite to the first surface of the foil in a region of the at least one slit opening, thereby closing the at least one slit opening while maintaining the at least one slit;

attaching the at least one electrically conductive wire to the first surface of the foil;

forming at least one perforation through the at least one electrically conductive wire and through the foil in a first edge region of the at least one slit, thereby interrupting the at least one electrically conductive wire in the first edge region of the at least one slit;

arranging at least two photovoltaic cells on the first surface of the foil such that:

an edge region of a first one of the at least two photovoltaic cells overlaps part of the at least one perforation formed at the first edge region of the at least one slit; and an edge region of a second one of the at least two photovoltaic cells overlaps a second edge region of the at least one slit; and attaching the at least two photovoltaic cells to the first surface of the foil.

* * * * *